US008835257B2

(12) United States Patent
Kim et al.

(10) Patent No.: US 8,835,257 B2
(45) Date of Patent: Sep. 16, 2014

(54) METHOD OF FABRICATING SEMICONDUCTOR DEVICE INCLUDING A RECESSED CHANNEL

(75) Inventors: Young-Pil Kim, Hwaseong-si (KR); Hyung-Ik Lee, Suwon-si (KR); Woo-Sung Jeon, Suwon-si (KR); Ki-Hong Kim, Asan-si (KR); Jung-Yun Won, Hwaseong-si (KR); In-Sun Jung, Hwaseong-si (KR)

(73) Assignee: Samsung Electronics Co., Ltd., Suwon-si, Gyeonggi-do (KR)

( * ) Notice: Subject to any disclaimer, the term of this patent is extended or adjusted under 35 U.S.C. 154(b) by 457 days.

(21) Appl. No.: 13/312,176

(22) Filed: Dec. 6, 2011

(65) Prior Publication Data
US 2012/0231605 A1 Sep. 13, 2012

(30) Foreign Application Priority Data

Mar. 8, 2011 (KR) ........................ 10-2011-0020462

(51) Int. Cl.
H01L 21/762 (2006.01)
H01L 27/105 (2006.01)
H01L 27/108 (2006.01)

(52) U.S. Cl.
CPC ...... H01L 27/1052 (2013.01); H01L 27/10876 (2013.01); H01L 21/76224 (2013.01)
USPC ............................ 438/270; 438/424; 257/330

(58) Field of Classification Search
USPC .................................................. 438/270, 427
See application file for complete search history.

(56) References Cited

U.S. PATENT DOCUMENTS

| 7,462,544 B2 | 12/2008 | Kim et al. | |
| 2008/0029810 A1* | 2/2008 | Kim et al. | 257/330 |
| 2010/0258858 A1* | 10/2010 | Kim | 257/330 |

FOREIGN PATENT DOCUMENTS

| JP | 2004-119616 A | 4/2004 |
| JP | 2004-140039 A | 5/2004 |
| KR | 10-2006-0003251 A | 1/2006 |
| KR | 10-2008-0001530 A | 1/2008 |

* cited by examiner

*Primary Examiner* — Olik Chaudhuri
*Assistant Examiner* — Wilner Jean Baptiste
(74) *Attorney, Agent, or Firm* — Lee & Morse, P.C.

(57) ABSTRACT

A method including forming an isolation trench; forming first and second liners on the isolation trench; filling the isolation trench an insulating material to form an isolation region and an active region; forming a preliminary gate trench including a first region across the isolation region to expose the first liner, the second liner, and the insulating material, and a second region across the active region to expose a portion of the substrate, the first region having a first sidewall with a planar shape, and the second region having a second sidewall with a concave central area such that an interface between the first and second regions has a pointed portion; removing a portion of the first liner exposed by the first region to form a dent having a first depth by which the pointed portion protrudes; removing the pointed portion to form a gate trench; and forming a gate electrode.

20 Claims, 23 Drawing Sheets

METHOD OF FABRICATING SEMICONDUCTOR DEVICE INCLUDING A RECESSED CHANNEL

CROSS-REFERENCE TO RELATED APPLICATION

Korean Patent Application No. 10-2011-0020462, filed on Mar. 8, 2011, in the Korean Intellectual Property Office, and entitled: "Method of Fabricating Semiconductor Device Including Recessed Channel," is incorporated by reference herein in its entirety.

BACKGROUND

1. Field

Embodiments relate to a method of fabricating a semiconductor device including a recessed channel.

2. Description of Related Art

With an increase in integration density of semiconductor devices, sizes of memory cells have been gradually downscaled to reduce a length of gate channels, thereby increasing the probability of causing a short channel effect (SCE). In order to reduce and/or prevent occurrence of the SCE, a semiconductor device in which a trench is formed in a substrate and a gate is formed within the trench so as to increase the length of a channel, has been considered.

SUMMARY

Embodiments are directed to a method of fabricating a semiconductor device including a recessed channel.

The embodiments may be realized by providing a method of fabricating a semiconductor device, the method including providing a substrate; removing a part of the substrate to form an isolation trench; forming a first liner on an inner surface of the isolation trench; forming a second liner on the first liner; forming an insulating material on the second liner until the isolation trench is filled to form an isolation region defining an active region in the substrate; forming a preliminary gate trench in the substrate, the preliminary gate trench including a first region disposed across the isolation region to expose the first liner, the second liner, and the insulating material, and a second region disposed across the active region to expose a portion of the substrate, the first region having a first sidewall with a planar shape, and the second region having a second sidewall with a concave central area such that an interface between the first and second regions has a pointed portion; removing a portion of the first liner exposed by the first region to form a dent such that the dent has a first depth by which the pointed portion protrudes; removing the pointed portion by performing a reflow process to convert the preliminary gate trench into a gate trench; and forming a gate insulating layer, a gate conductive pattern, and a gate capping pattern within the gate trench.

The substrate may include silicon, the first liner may include thermal silicon oxide, the second liner may include silicon nitride, and the insulating material may include silicon oxide.

The first region of the preliminary gate trench may have a first width, the second region of the preliminary gate trench may have a second average width, and the second average width may be greater than the first width.

A first region of the gate trench may have a third width, a second region of the gate trench may have a fourth average width, and the fourth average width may be smaller than the third width.

The second average width may be smaller than the fourth average width.

The second average width may be greater than the first width by a first length, and the first depth of the dent may be greater than the first length.

The second region of the preliminary gate trench may have a maximum width and a minimum width, the maximum width being greater than the fourth average width and the minimum width being smaller than the fourth average width.

Removing the pointed portion may include linearizing or planarizing the second sidewall of the second region of the preliminary gate trench.

Removing the pointed portion may include leading silicon atoms of the pointed portion to move toward the concave central area of the second sidewall to convexly transform the second sidewall of the gate trench.

Performing the reflow process may include annealing the protruding pointed portion in a hydrogen-containing gas atmosphere in an airtight chamber maintained under a pressure of about 0.1 to about 10 Torr at a temperature of about 650 to about 1,000° C. by supplying hydrogen gas at a flow rate of about 0.1 to about 50 standard liters per minute.

Removing the portion of the first liner exposed by the first region to form the protruding pointed portion may include removing a portion of the insulating material exposed by the first region to a depth greater than the first depth.

The embodiments may also be realized by providing a method of fabricating a semiconductor device, the method including providing a substrate; removing a part of the substrate to form an isolation trench; forming a first liner on an inner surface of the isolation trench; forming an insulating material on the first liner until the isolation trench is filled to form an isolation region defining an active region in the substrate; forming a preliminary gate trench in the substrate, the preliminary gate trench including a first region disposed across the isolation region to expose the first liner and the insulating material, and a second region disposed across the active region to expose a portion of the substrate, the first region having a first width, a central area of the second region having a second width greater than the first width, and the substrate having a pointed portion at an interface between the first region and the second region; increasing the first width of the first region to protrude the pointed portion; removing the pointed portion by performing a reflow process to convert the preliminary gate trench into a gate trench; and forming a gate insulating layer, a gate conductive pattern, and a gate capping pattern within the gate trench.

Forming the isolation region may include further forming a second liner between the first liner and the insulating material, such that a portion of the second liner is exposed in the first region.

Removing the pointed portion may include reducing the second width of the second region.

Increasing the first width may include simultaneously removing a portion of the first liner and removing a portion of the insulating material.

The embodiments may also be realized by providing a method of fabricating a semiconductor device, the method including providing a substrate; forming an isolation trench in the substrate; forming a first liner on an inner surface of the isolation trench; filling an insulating material in the isolation trench to form an isolation region such that the isolation region defines an active region in the substrate; forming a preliminary gate trench in the substrate, the preliminary gate trench including a first region in the isolation region and exposing the first liner and the insulating material, and a second region in the active region and exposing a portion of the substrate, the first region having a first sidewall with a planar shape, and the second region having a second sidewall with a concave central area such that an interface between the first and second regions has a pointed portion; removing a portion of the first liner exposed by the first region to form a dent such that the dent has a first depth, the pointed portion protruding adjacent to the dent; removing the pointed portion by performing a reflow process such that the preliminary gate trench is converted into a gate trench; and forming a gate electrode within the gate trench such that the gate electrode includes a gate insulating layer, a gate conductive pattern, and a gate capping pattern.

The method may further include forming a second liner on the first liner prior to filling the insulating material in the isolation trench.

The first region may have a first width, and all portions of the concave central area of the second region may have a width greater than the first width.

An interface between the active region and the gate electrode may have a planar shape.

An interface between the active region and the gate electrode may have a curved shape that convexly protrudes into the gate electrode.

BRIEF DESCRIPTION OF THE DRAWINGS

The embodiments will become apparent to those of ordinary skill in the art by describing in detail exemplary embodiments with reference to the attached drawings, in which:

FIGS. 7A through 12A illustrate partial enlarged views of a portion P of FIG. 1A, showing stages in a method of fabricating the semiconductor device of FIG. 1A;

FIGS. 7B through 12B illustrate longitudinal sectional views taken along line I-I' of FIGS. 7A through 12A, respectively;

DETAILED DESCRIPTION OF THE EMBODIMENTS

Figure 1A:
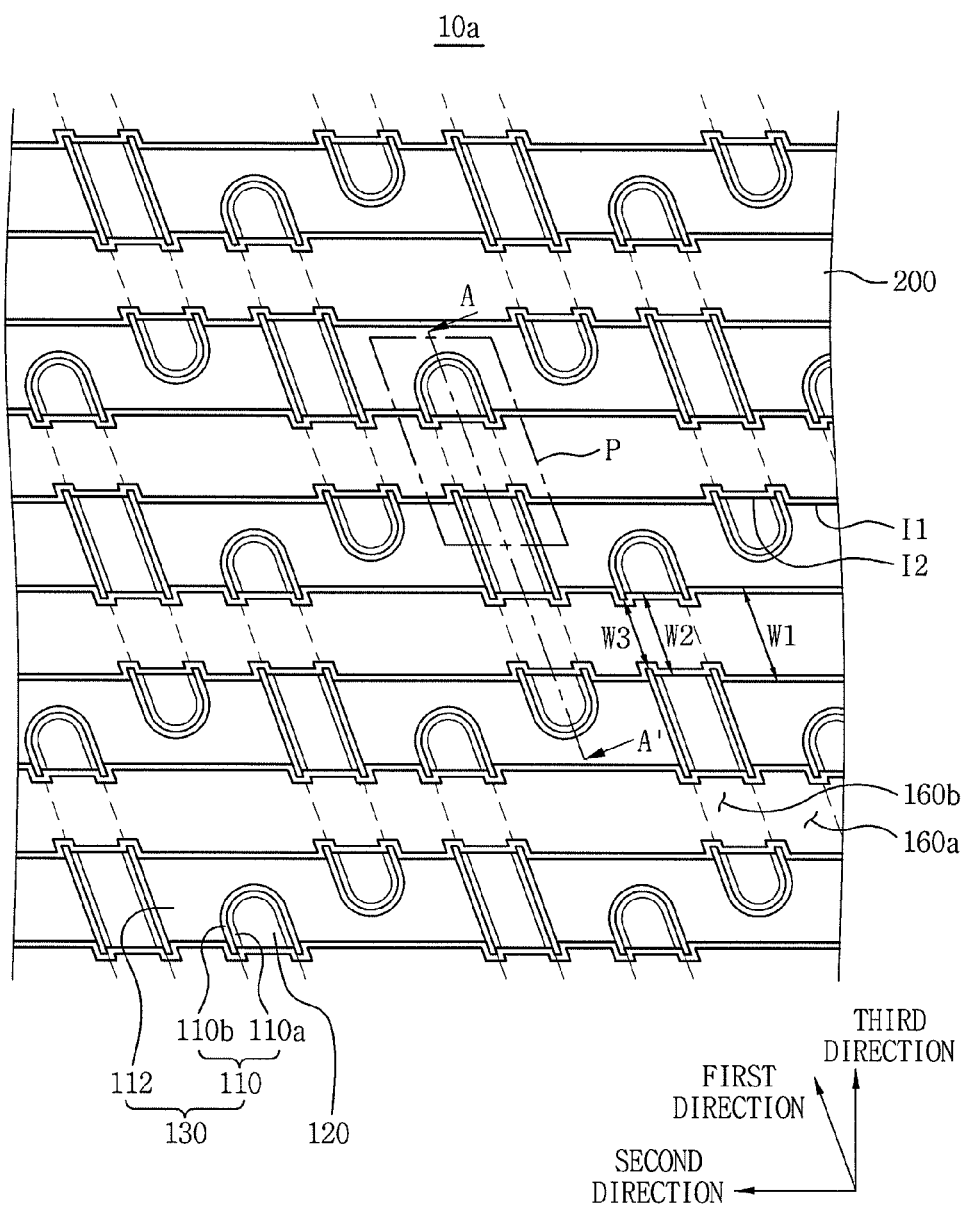
FIG. 1A illustrates a plan view of a semiconductor device according to an embodiment.

Example embodiments will now be described more fully hereinafter with reference to the accompanying drawings; however, they may be embodied in different forms and should not be construed as limited to the embodiments set forth herein. Rather, these embodiments are provided so that this disclosure will be thorough and complete, and will fully convey the scope of the invention to those skilled in the art.

In the drawing figures, the dimensions of layers and regions may be exaggerated for clarity of illustration. It will also be understood that when a layer or element is referred to as being "on" another layer or substrate, it can be directly on the other layer or substrate, or intervening layers may also be present. Further, it will be understood that when a layer is referred to as being "under" another layer, it can be directly under, and one or more intervening layers may also be present. In addition, it will also be understood that when a layer is referred to as being "between" two layers, it can be the only layer between the two layers, or one or more intervening layers may also be present. Like reference numerals refer to like elements throughout.

Figure 1B:
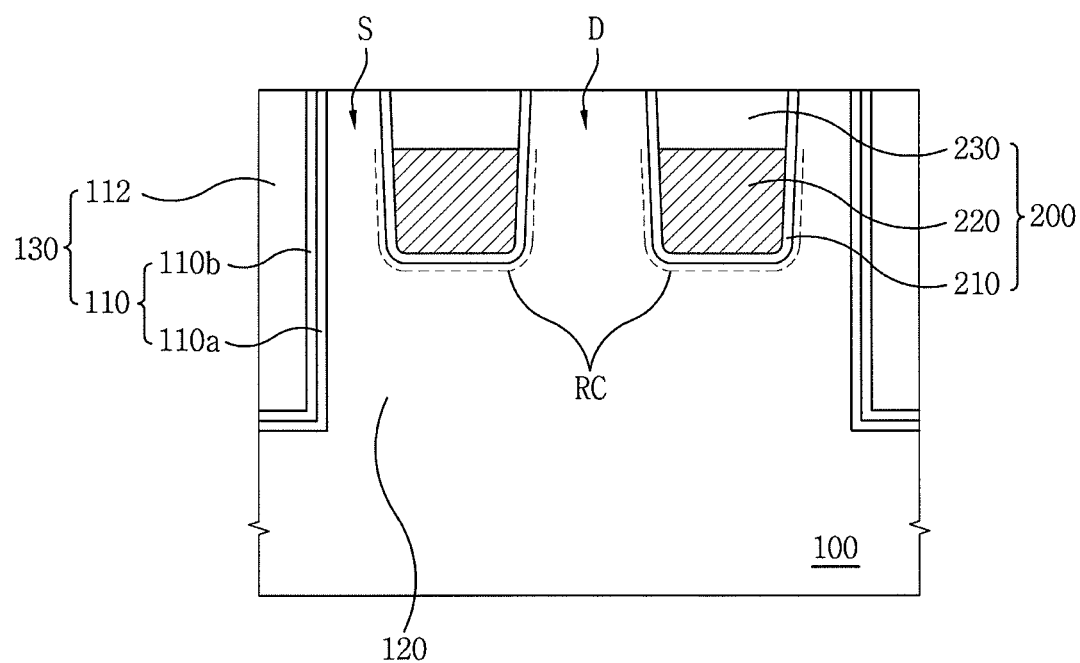
FIG. 1B illustrates a longitudinal sectional view taken along line A-A' of FIG. 1A.

FIG. 1A illustrates a plan view of a semiconductor device according to an embodiment. FIG. 1B illustrates a longitudinal sectional view taken along line A-A' of FIG. 1A.

Referring to FIGS. 1A and 1B, a semiconductor device 10a according to the present embodiment may include active regions 120, an isolation region 130 (defining the active regions 120), and a plurality of parallel gate electrodes 200 (disposed across the active regions 120 and the isolation region 130 in a second direction).

The plurality of active regions 120 may be repetitively arranged at predetermined intervals. Each of the active regions 120 may have a bar shape having a major axis elongated in a first direction. Each of the active regions 120 may include a source region S and a drain region D.

The isolation region 130 may include a liner 110 and an insulating material 112. In an implementation, the liner 110 may include a double layer. For example, the liner 110 may include a first liner 110a and a second liner 110b. The first liner 110a may include, e.g., thermal silicon oxide, and the second liner 110b may include, e.g., silicon nitride. The insulating material 112 may include, e.g., silicon oxide.

Each of the gate electrodes 200 may include a gate insulating layer 210, a gate conductive pattern 220, and a gate capping pattern 230. The semiconductor device 10a may include a recessed channel RC formed in a direction vertical to the surface of the substrate 100 around the gate insulating layer 210.

The gate electrodes 200 may be parallel to one another and may extend in the second direction. One active region 120 may intersect two rows of gate electrodes 200. The second direction may be at a predetermined angle relative to the first direction.

Lateral surfaces of the gate electrodes 200 may be rugged or curved. For example, a first interface I1 between the gate electrodes 200 and the isolation region 130 and a second interface I2 between the gate electrodes 200 and the active regions 120 may not be aligned with each other on a straight line or a same plane. For example, the gate electrode 200 may have different widths in a first region 160a (where the gate electrode 200 intersect the isolation region 130) and a second region 160b (where the gate electrode 200 intersect the active regions 120). In an implementation, a first width W1 of the gate electrode 200 in the first region 160a may be greater than a second width W2 of the gate electrode 200 in the second region 160b. In an implementation, the first and second interfaces I1 and I2 may be linearized or planarized in the first region 160a and the second region 160b, respectively.

The second liners 110b may protrude toward the gate electrodes 200. For example, a third width W3 of the gate electrode 200 in a region where the gate electrode 200 intersects the second liner 110b may be smaller than the first width W1 and the second width W2.

Figure 2:
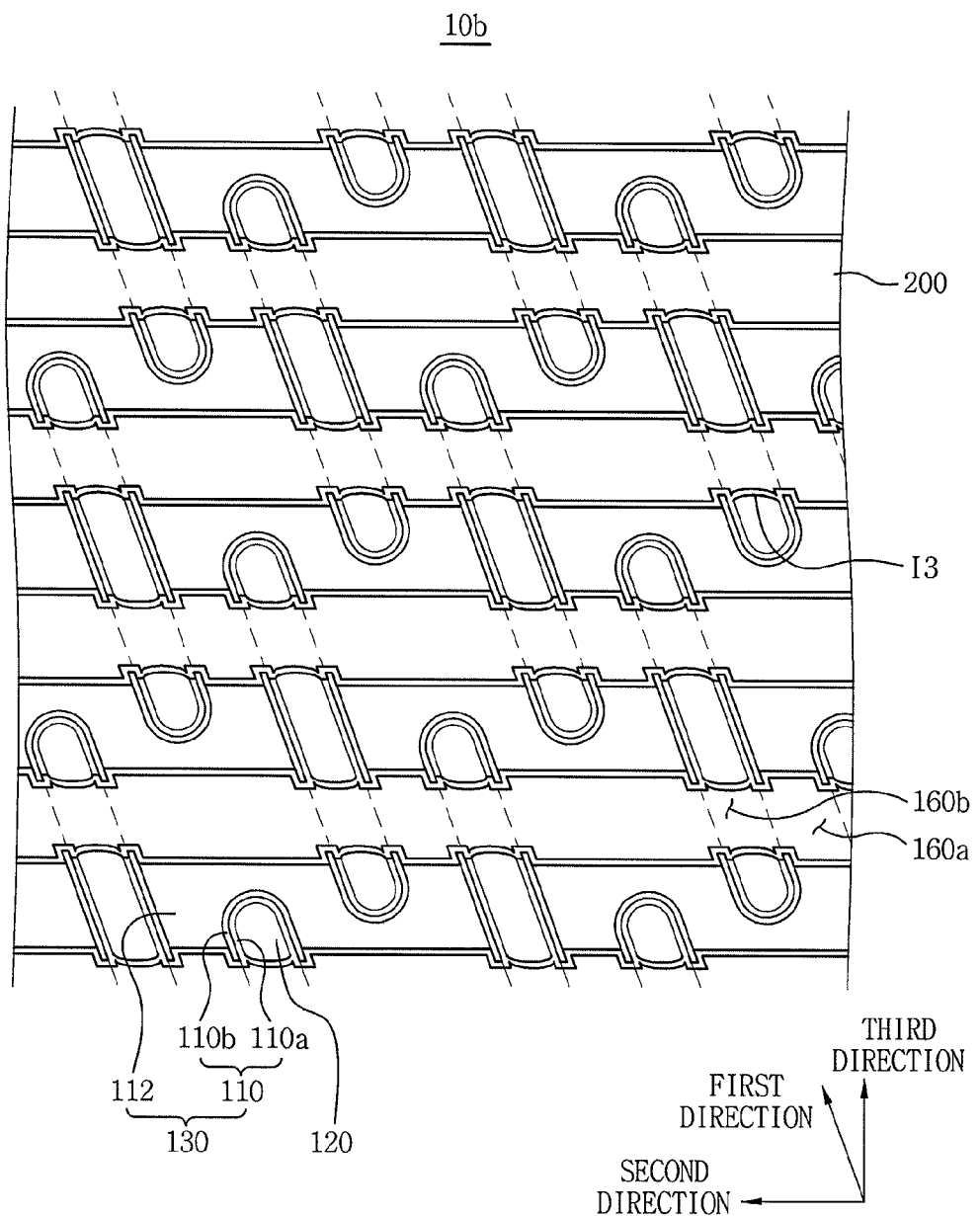
FIG. 2 illustrates a plan view of a semiconductor device according to another embodiment.

FIG. 2 illustrates a plan view of a semiconductor device according to another embodiment. Referring to FIG. 2, an interface I3 between the gate electrode 200 and the active region 120 may convexly protrude toward or into the gate electrode 200 in a region 160b where the gate electrode 200 intersects the active region 120.

Figure 3A:
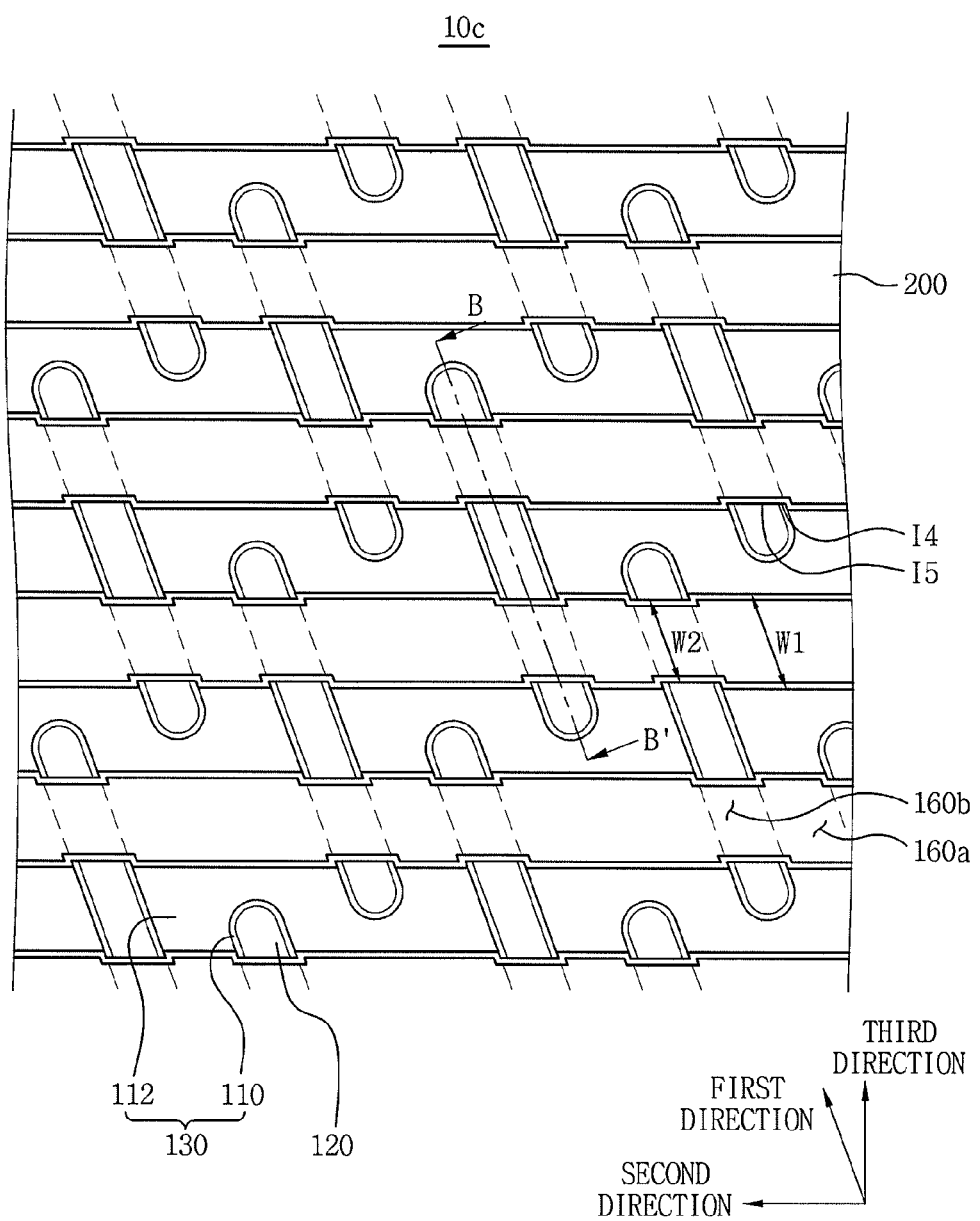
FIG. 3A illustrates a plan view of a semiconductor device according to yet another embodiment.
Figure 3B:
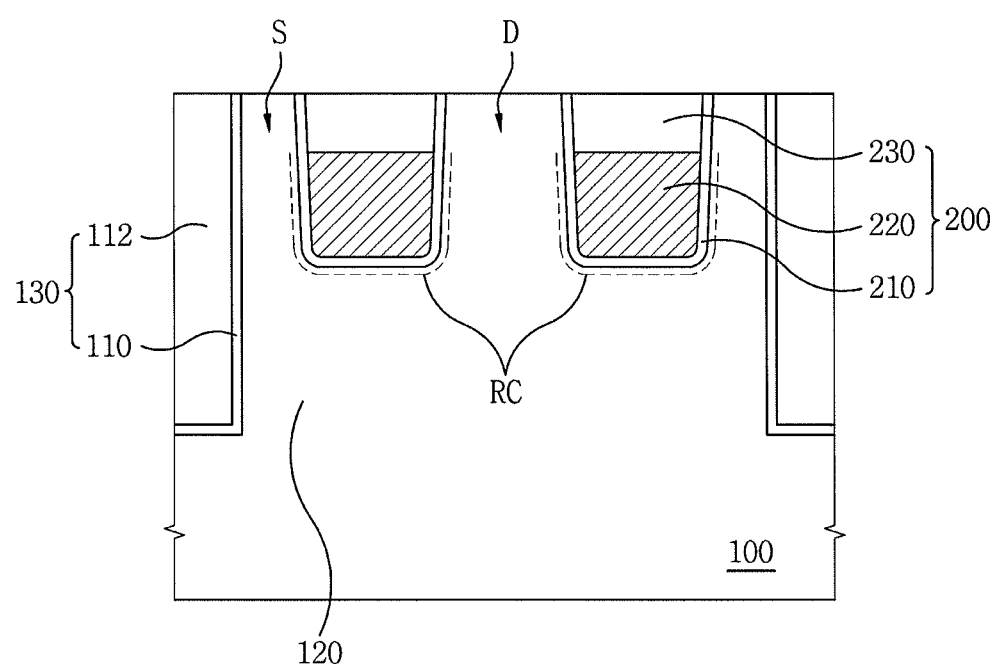
FIG. 3B illustrates a longitudinal sectional view taken along line B-B' of FIG. 3A.

FIG. 3A illustrates a plan view of a semiconductor device according to yet another embodiment. FIG. 3B illustrates a longitudinal sectional view taken along line B-B' of FIG. 3A. Referring to FIGS. 3A and 3B, a semiconductor device 10c according to the present embodiment may include a liner 110 formed of a single layer. For ease of explanation, FIGS. 3A and 3B briefly illustrate that an interface I4 between the gate electrode 200 and the liner 110, and an interface I5 between the gate electrode 200 and the active region 120 are aligned with each other on the same straight line or the same plane. However, in an implementation, the interface I4 (between the gate electrode 200 and the liner 110) and the interface I5 (between the gate electrode 200 and the active region 120) may not be aligned with each other along the same straight line. In the present embodiment, a first width W1 of a first region 160a may be greater than a second width W2 of a second region 160b. In an implementation, the interface I5 between the gate electrode 200 and the active region 120 may have a planar shape.

Figure 4A:
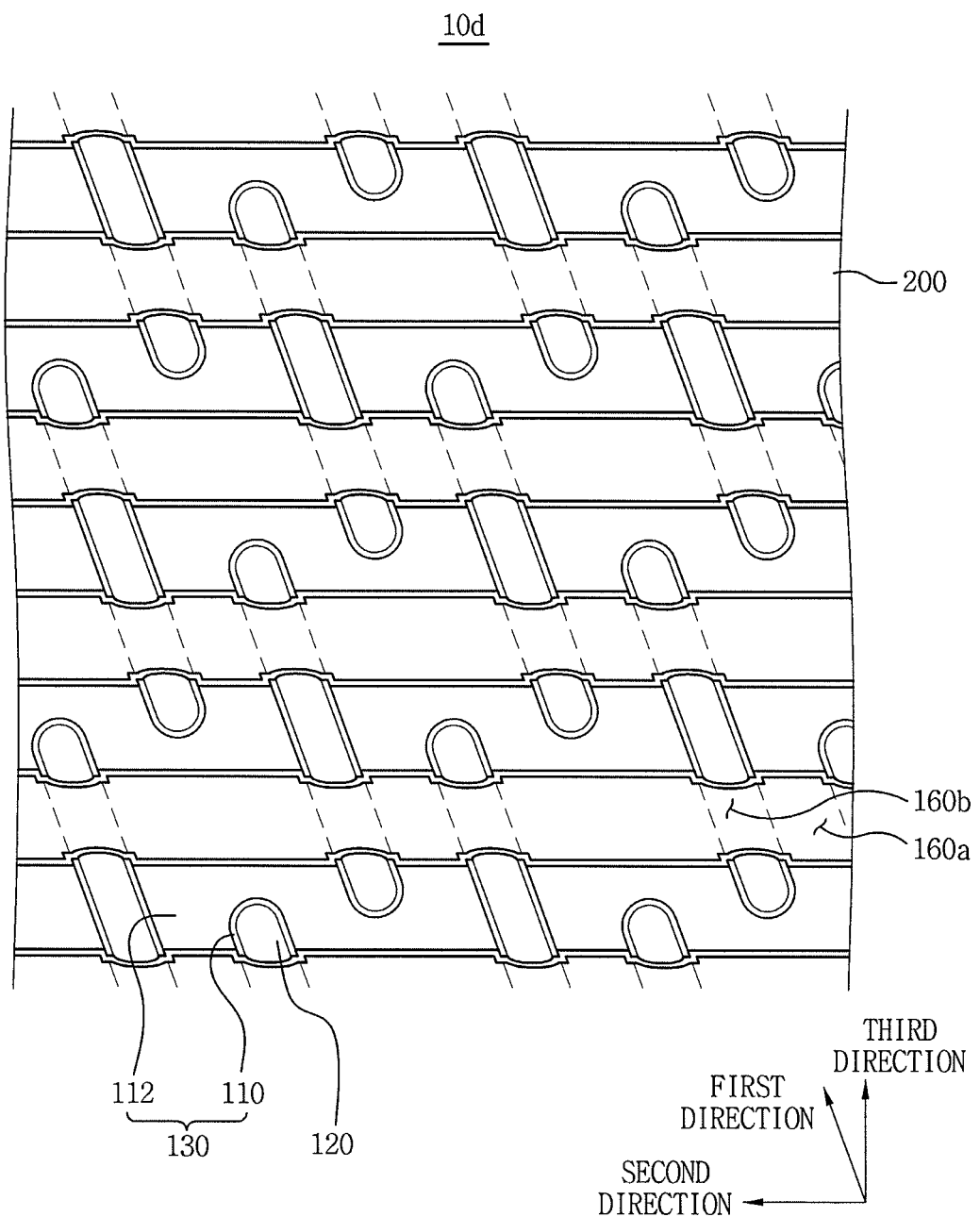
FIGS. 4A, 4B, and 4C illustrate plan views of semiconductor devices according to still other embodiments.
Figure 4B:
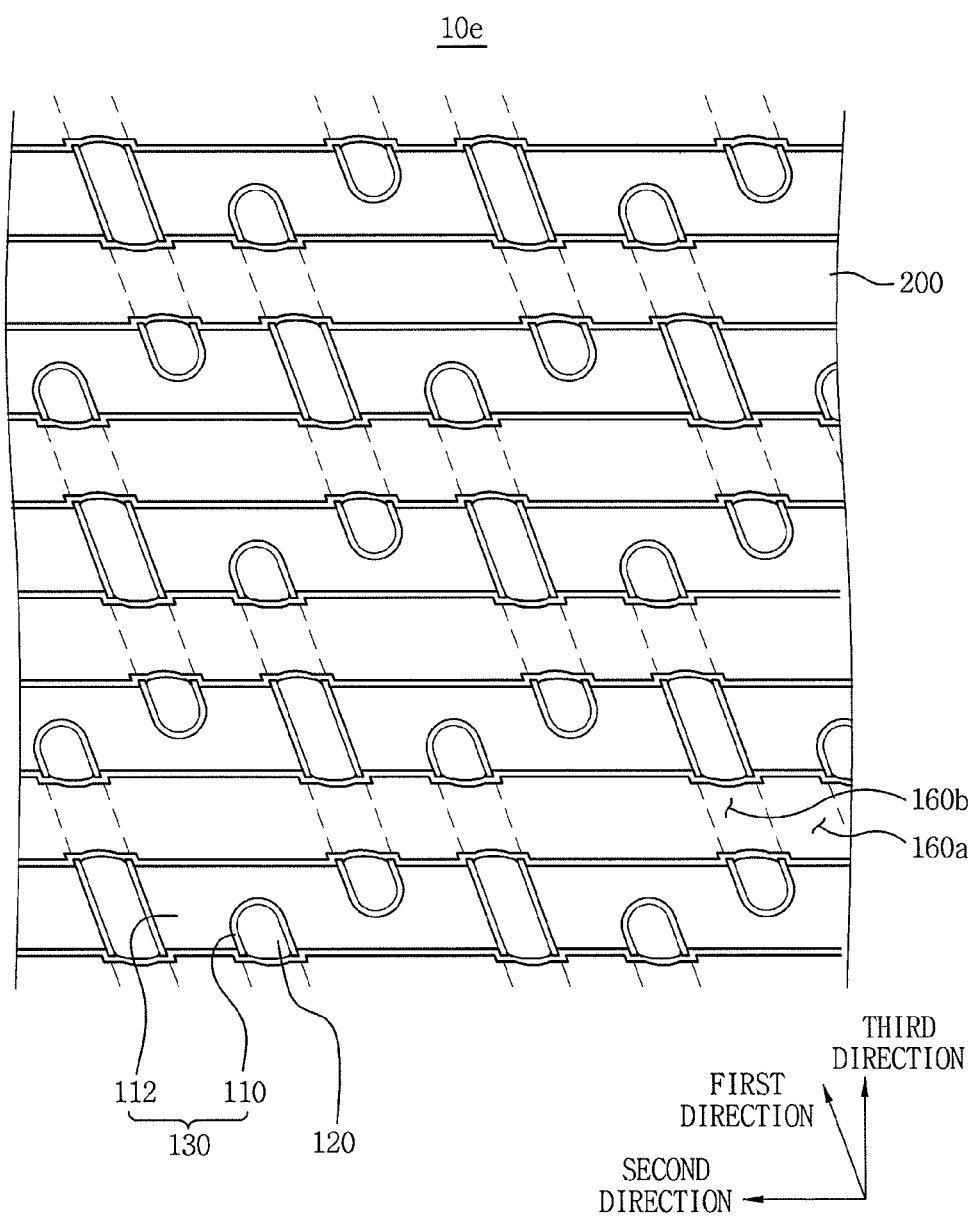
Figure 4C:
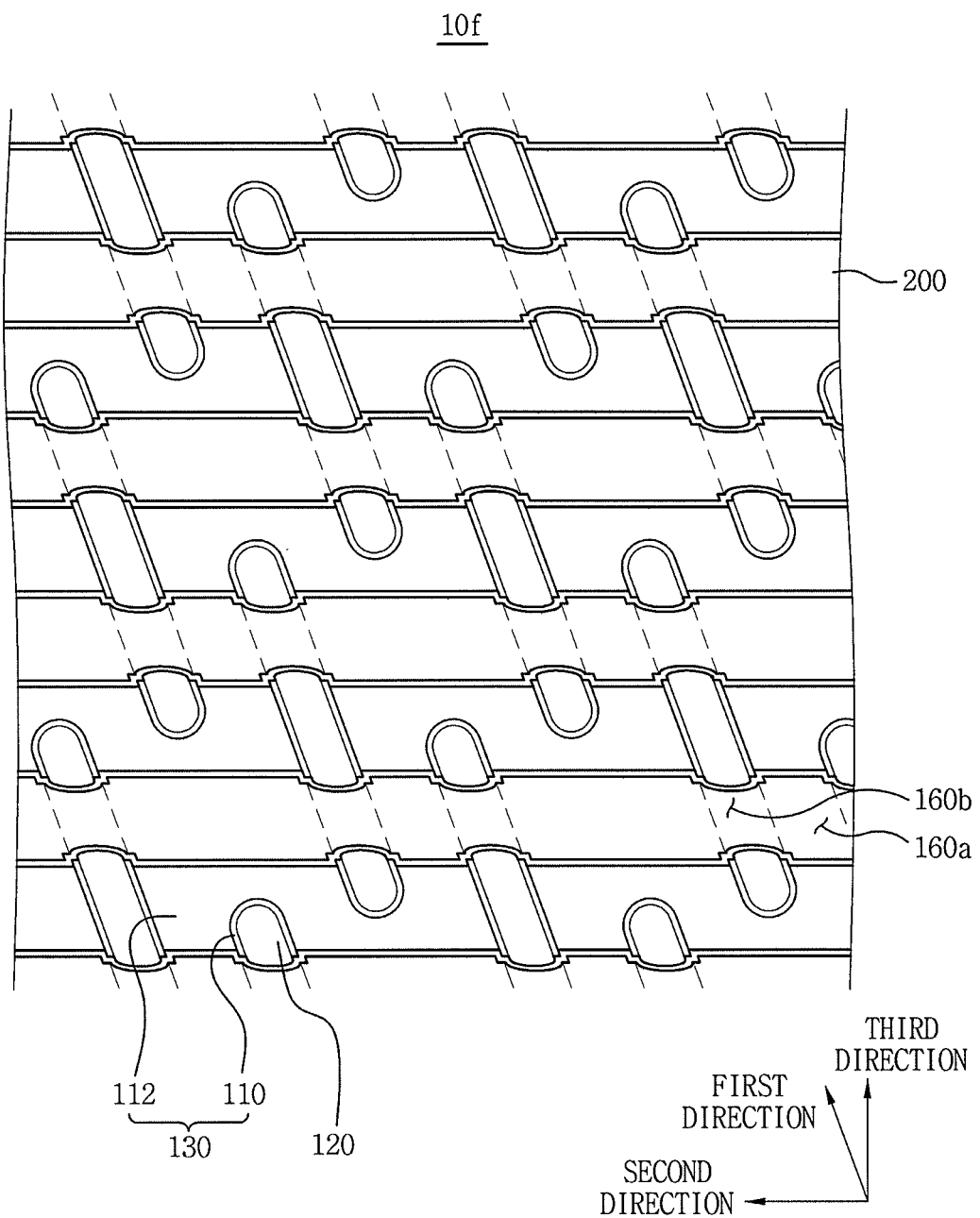

FIGS. 4A, 4B, and 4C illustrate plan views of semiconductor devices according still other embodiments. Referring to FIGS. 4A, 4B, and 4C, each of the semiconductor devices 10d to 10f according to the embodiments may include a liner 110 (formed of a single layer) and an active region 120 (having a convex shape). A description of other components will be understood with reference to FIGS. 2, 3A, and 3B. Referring to FIG. 4A, convex end portions of the active region 120 may be aligned with end portions of the liner 110. Referring to FIG. 4B, convex end portions of the active region 120 may be disposed inwardly from end portions of the liner 110. Referring to FIG. 4C, convex end portions of the active region 120 may protrude outwardly from end portions of the liner 110. The above-described embodiments may expand and be applied to any other embodiments. Only typical embodiments will be illustrated and described to avoid complexity of illustration.

Figure 5A:
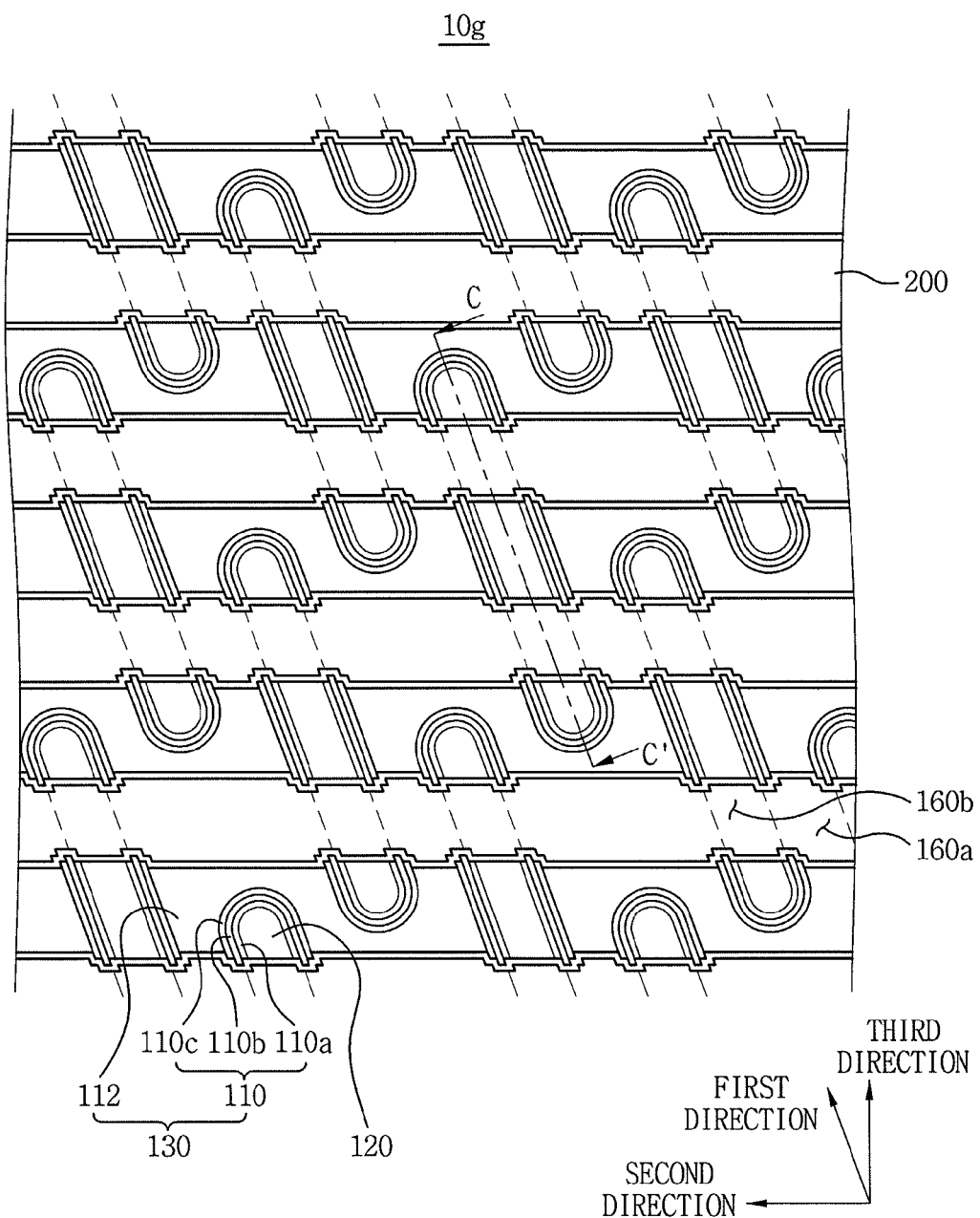
FIGS. 5A and 5B respectively illustrate a plan view and longitudinal sectional view of a semiconductor device according to still another embodiment.
Figure 5B:
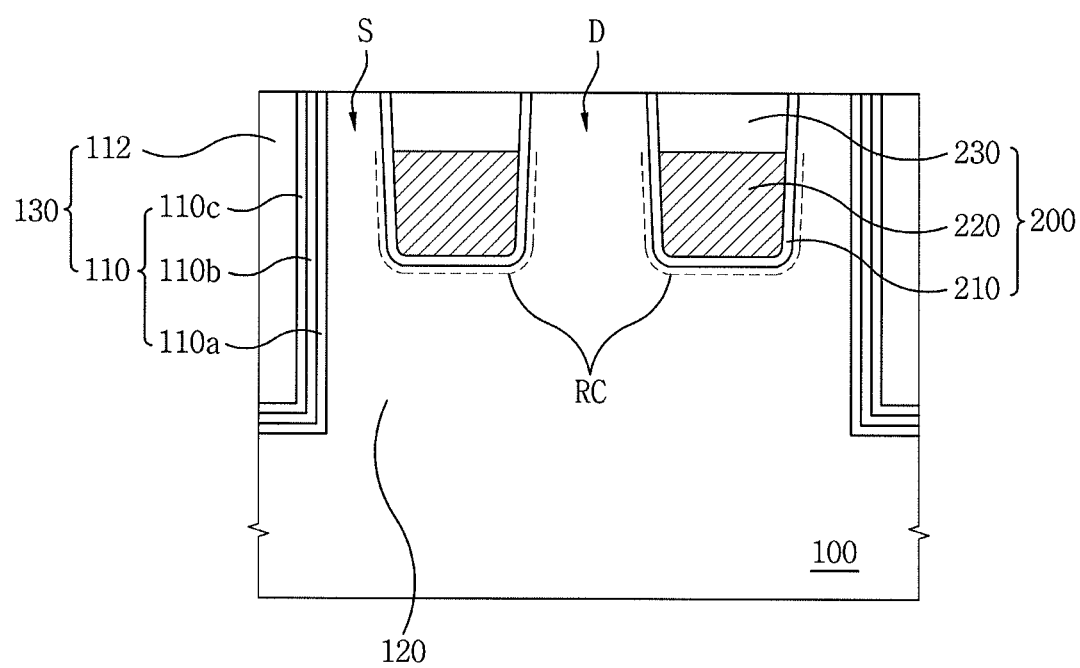

FIG. 5A illustrates a plan view of a semiconductor device according to still another embodiment. FIG. 5B illustrates a longitudinal sectional view taken along line C-C' of FIG. 5A. Referring to FIGS. 5A and 5B, a semiconductor device 10g according to the present embodiment may include a liner 110 formed of three or more layers. For example, the liner 110 may include a first liner 110a, a second liner 110b, and a third liner 110c. End portions of the first liner 110a and end portions of the third liner 110c may be aligned with each other along a straight line or in a same plane. The first liner 110a and the third liner 110c may include the same material. For example, the first liner 110a and the third liner 110c may include silicon oxide. The second liner 110b may include, e.g., silicon nitride.

Figure 6:
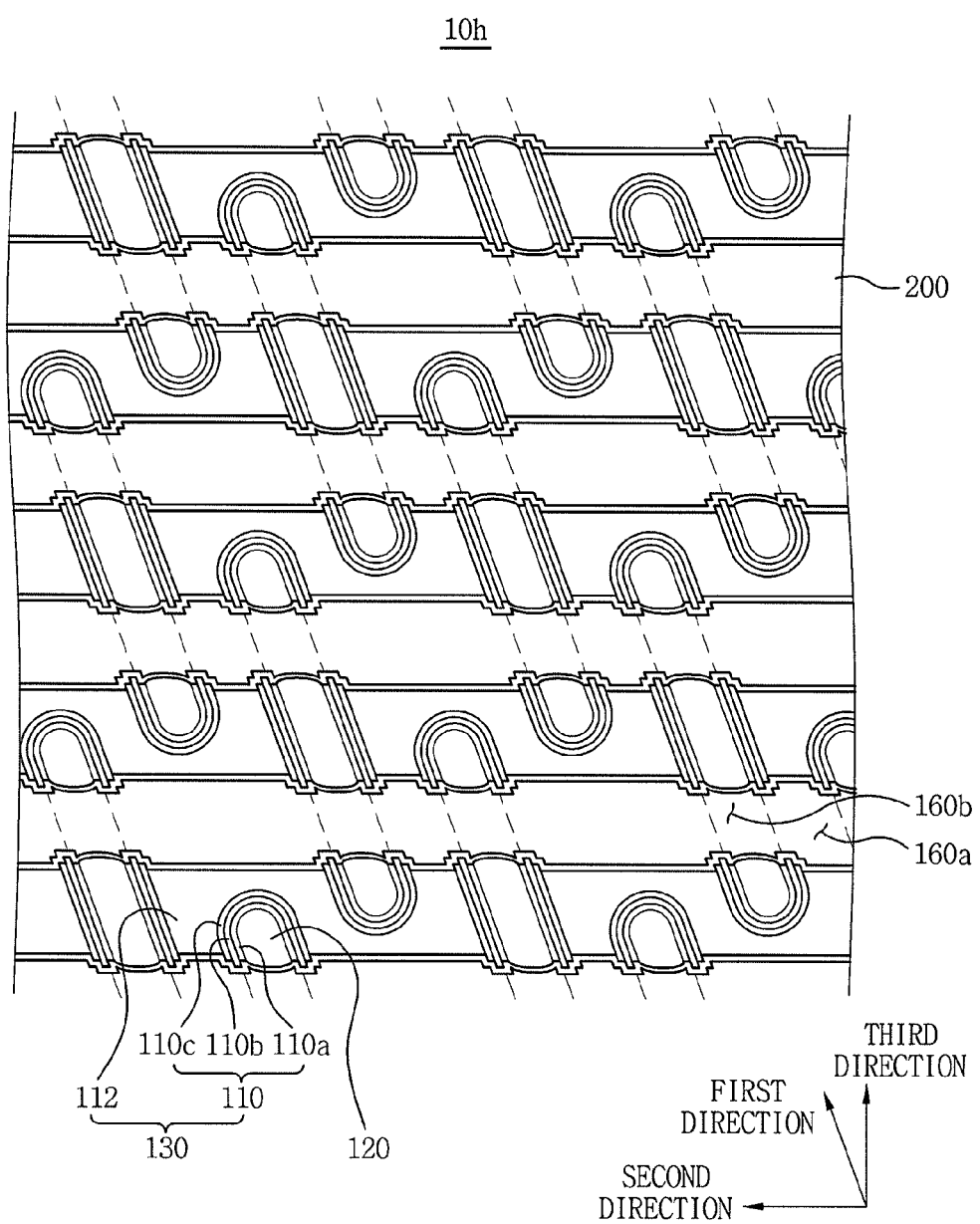
FIG. 6 illustrates a plan view of a semiconductor device according to still another embodiment.

FIG. 6 illustrates a plan view of a semiconductor device according to still another embodiment. Referring to FIG. 6, the semiconductor device 10h according to the present embodiment may include the liner 110 (formed of a triple layer) and the active region 120 (having a convex shape). A description of other components of the semiconductor device 10h according to the present embodiment will be understood with reference to FIGS. 2, 4A through 4C, 5A, and 5B.

The semiconductor devices 10a to 10h according to the embodiments may be separately or simultaneously applied or various embodiments may be applied together with the semiconductor devices 10a to 10h according to the embodiments. For example, end portions of interfaces between the gate electrodes 200 and the active regions 120 and end portions of interfaces between the gate electrodes 200 and the liners 110 may or may not be aligned with or correspond to each other. Therefore, it may be inferred that various resultant structures may be obtained according to a method of applying fabrication processes.

Hereinafter, methods of fabricating semiconductor devices according to the embodiments will be described in detail with reference to the appended drawings.

FIGS. 7A through 12A illustrate partial enlarged views of a portion P of FIG. 1A, showing stages in a method of fabricating the semiconductor device of FIG. 1A. FIGS. 7B through 12B illustrate longitudinal sectional views taken along line I-I' of FIGS. 7A through 12A, respectively.

Figure 7A:
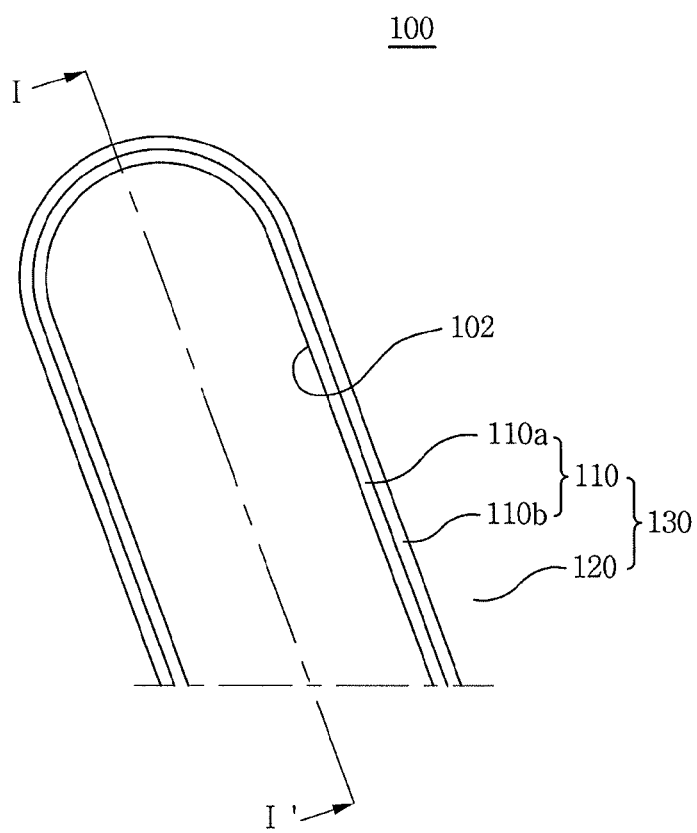
Figure 7B:
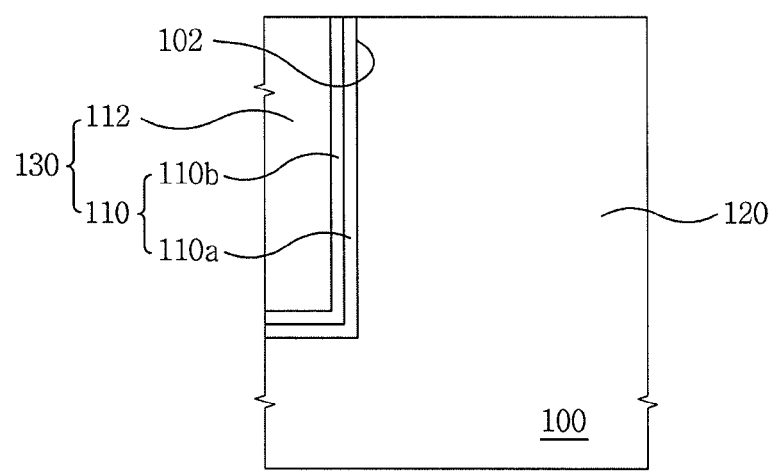

Referring to FIGS. 7A and 7B, an isolation region 130 may be formed in a substrate 100. The substrate 100 may include, e.g., single crystalline silicon or silicon germanium. The isolation region 130 may include a liner 110 and an insulating material 112. First, an isolation trench 102 may be formed by removing a portion of the substrate 100 using, e.g., a plasma etching process or wet etching process. Subsequently, the liner 110 may be formed on a surface of the substrate 100 and an inner surface of the isolation trench 102. The liner 110 may be formed of a double layer. For example, the liner 110 may include a first liner 110a (directly formed on the inner surface of the isolation trench 102) and a second liner 110b (directly formed on the first liner 110a). The first liner 110a may include, e.g., a silicon oxide layer. For example, the first liner 110a may be formed by performing a surface oxidation process on the inner surface of the isolation trench 102. In an implementation, a mid-temperature oxide (MTO) layer may be formed by performing a thermal oxidation process on the inner surface of the isolation trench 102 to a thickness of about 5 to about 50 Å. The MTO layer may be formed by performing a wet oxidation process at a temperature of about 500 to about 700° C. The second liner 110b may include, e.g., a silicon nitride (SiN) layer. The second liner 110b may be formed using, e.g., a chemical vapor deposition (CVD) process on the first liner 110a to a thickness of about 10 to about 80 Å. Next, the insulating material 112 may be formed on the second liner 110b to fill the isolation trench 102. The insulating material 112 may include, e.g., various silicon oxide layers, such as boron phosphorous silicate glass (BPSG), undoped silicate glass (USG), tonen silazene (TOSZ), or high-density plasma (HDP). Afterwards, components disposed above a surface of the substrate 100 may be removed using, e.g., a chemical mechanical polishing (CMP) process, thereby forming the isolation region 130. The isolation region 130 may be formed to surround the active region 120. Thus, the active region 120 may have an island shape.

Figure 8A:
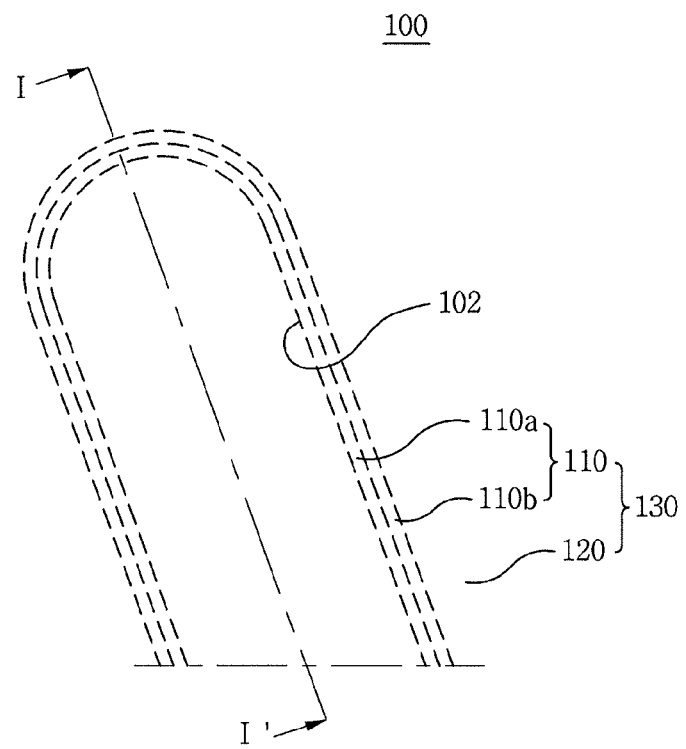
Figure 8B:
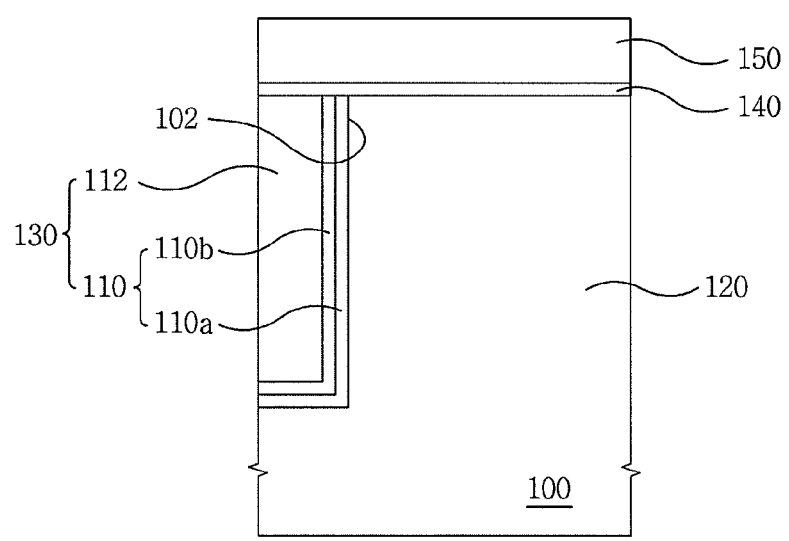

Referring to FIGS. 8A and 8B, a pad insulating layer 140 and a mask layer 150 may be blanket-formed on the substrate 100. The pad insulating layer 140 may include, e.g., silicon oxide, and may be formed using, e.g., an oxidation process or CVD process. The mask layer 150 may include, e.g., silicon nitride, and may be formed using, e.g., a CVD process. In an implementation, the pad insulating layer 140 and the mask layer 150 may be replaced by a single photoresist layer.

Figure 9A:
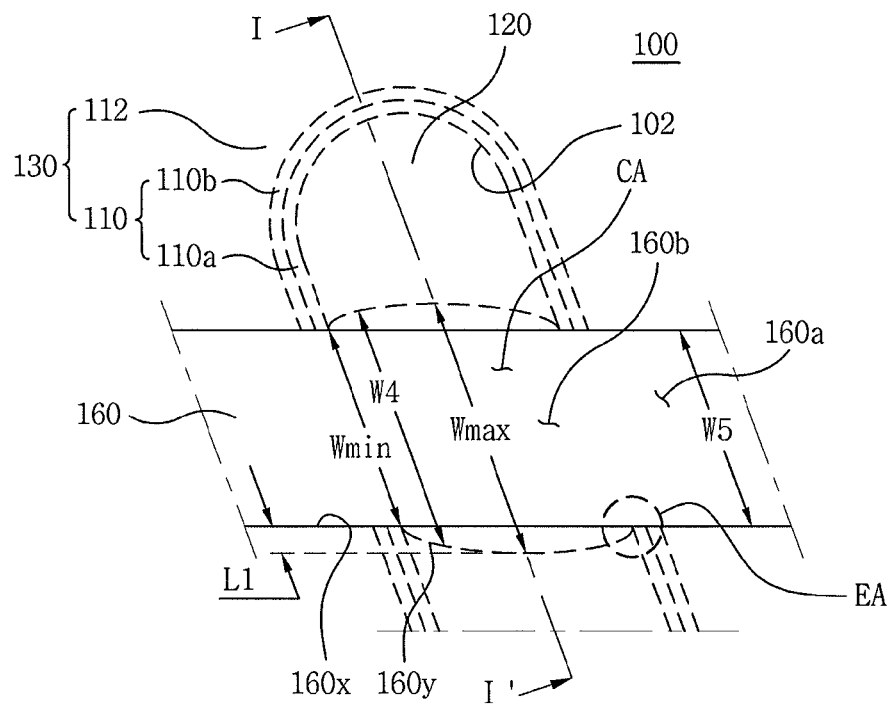
Figure 9B:
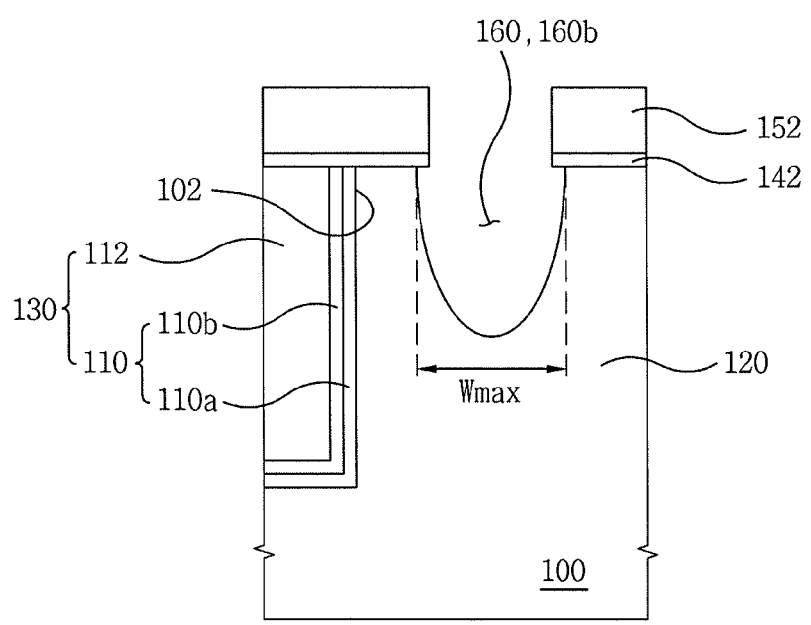

Referring to FIGS. 9A and 9B, a preliminary gate trench 160 may be formed. First, the pad insulating layer (refer to 140 in FIG. 8B) and the mask layer (refer to 150 in FIG. 8B) may be patterned to form a pad insulating pattern 142 and a mask pattern 152 (used for forming the preliminary gate trench 160). A portion of a top surface of the isolation region 130 and a portion of a top surface of the active region 120 may be exposed by the pad insulating pattern 142 and the mask pattern 152. By using the mask pattern 152 and the pad insulating pattern 142 as an etch mask, the exposed portions of the isolation region 130 and the active region 120 may be removed to a predetermined depth using, e.g., a plasma etching process. Thus, the preliminary gate trench 160 (extending in the second direction of FIG. 1A) may be formed within the substrate 100. A plurality of preliminary gate trenches 160 may be repetitively arranged parallel to one another in a third direction. For example, a plasma dry etching process may be performed using a gas mixture of chlorine ($Cl_2$) and hydrogen bromide (HBr) under a pressure of about 5 to about 50 mTorr at a power of about 50 to about 100 W. In this case, the exposed inner surface of the preliminary gate trench 160 may be damaged by plasma during the plasma dry etching process. When the pad insulating layer (refer to 140 in FIG. 8B) and the mask layer (refer to 150 in FIG. 8B) are replaced by a photoresist layer, the pad insulating pattern 142 and the mask pattern 152 may be replaced by a single photoresist pattern.

The preliminary gate trench 160 may include a first region 160a (disposed across the isolation region 130) and a second region 160b (disposed across the active region 120). The first liner 110a, the second liner 110b, and the insulating material 112 may be exposed in the first region 160a. A portion of the substrate 100 corresponding to the active region 120 may be exposed in the second region 160b. The surface of the active region 120 may be removed to a greater width than the surface of the isolation region 130. Accordingly, a fourth width W4 of the second region 160b (disposed across the active region 120) may be greater than a fifth width W5 of the first region 160a (disposed across the isolation region 130). The fourth width W4 and/or the fifth width W5 may refer to average widths of the second and first regions 160b and 160a, respectively. In an implementation, all portions of the concave central area of the second region 160b may have a width that is greater than the fourth width W4 of the first region 160a. The second region 160b may have a smaller width in an edge area EA than in a central area CA thereof. Accordingly, the fourth width W4 may include a minimum width Wmin in the edge area EA that similar or substantially equal to the fifth width W5, and a maximum width Wmax in the central area CA that is greater than the fifth width W5. The maximum width Wmax may be greater than the minimum width Wmin by two times a first length L1, i.e., on each side of the second region 160b. The preliminary gate trench 160 may include a first sidewall 160x (having a straight or planar plane surface in the first region 160a) and a second sidewall 160y (having a concave curved surface in the second region 160b).

The active region 120 may have a pointed portion at an interface (i.e., the edge area EA) between the first and second regions 160a and 160b. For example, the surface or portions of the active region 120 of the central areas CA may be removed to a greater width or degree than the surface or portions of the edge area EA in the second region 160b, so that the second sidewall 160y of the edge area EA may have both pointed end portions and a concavely round central portion. The active region 120 may have a most pointed portion at a contact point between the first sidewall 160x (having a straight or planar inner surface) and the second sidewall 160y (having a concave inner surface). Afterwards, the mask pattern 152 may be removed by a wet process using phosphoric acid ($H_3PO_4$).

Figure 10A:
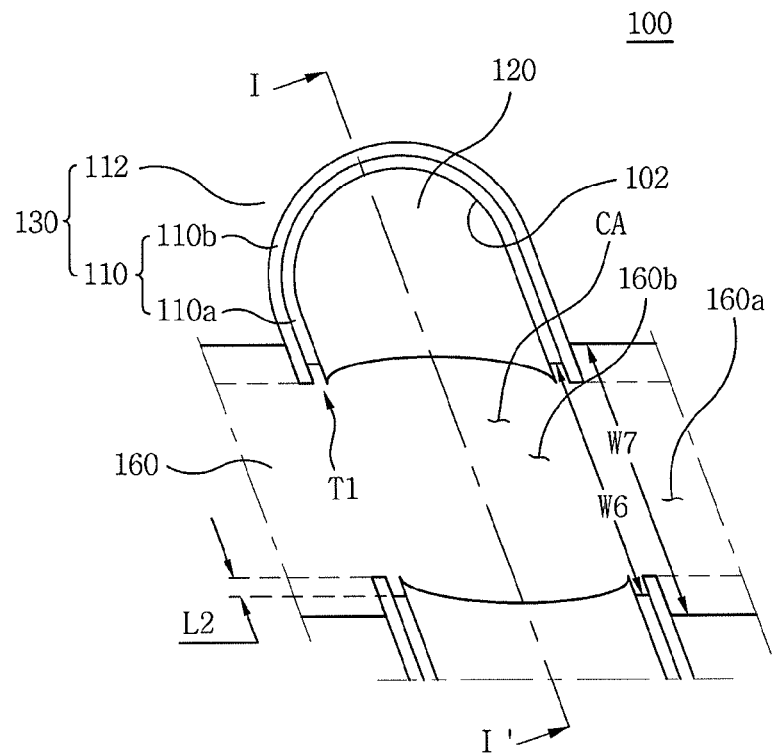
Figure 10B:
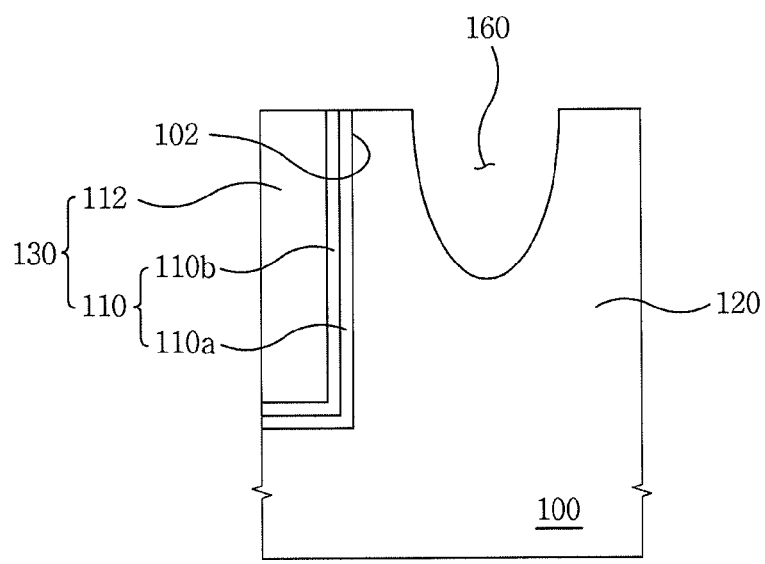

Referring to FIGS. 10A and 10B, the pad insulating pattern 142, a portion of the liner 110, and a portion of the insulating material 112 may be removed. For example, between the active region 120 and the second liner 110b, a portion of the first liner 110a may be removed to form a dent T1. The second liner 110b may protrude between the first liner 110a and the insulating material 112.

In addition, as shown in FIG. 10B, when the pad insulating pattern 142 remains on the substrate 100, the pad insulating pattern 142 may also be removed during the present removal process, and the top surfaces of the first liner 110a and the insulating material 112 may be maintained at a same level as the top surface of the active region 120. Alternatively, top surfaces of the first liner 110a and the insulating material 112 may be lower than the top surface of the active region 120.

The formation of the dent T1 may include performing an etching process or a cleaning process. The etching process or cleaning process may include, e.g., a dry process or wet process. For example, the wet process may be performed using a cleaning solution containing dilute fluoric acid (HF). When the first liner 110a includes a thermal oxide layer (e.g., an MTO layer) and the insulating material 112 includes a deposited oxide layer (e.g., an HDP silicon oxide layer), the insulating material 112 may be removed in a greater width or to a greater degree than the first liner 110a. For example, the insulating material 112 may be removed in a greater width or to a greater degree than the first liner 110a. Accordingly, a sixth width W6 (between the first liners 110a) may be smaller than a seventh width W7 (between the insulating materials 112). In FIG. 10A, an interface between the insulating materials 112 and the preliminary gate trench 160 (before the insulating materials 112 are removed) is illustrated with a dotted line. Although a depth L2 of the dent T1 (formed by removing the first liner 110a) is not specifically limited, the depth L2 of the dent T1 may be equal to or less than the first length (refer to L1 in FIG. 9A). A final profile may depend on the depth L2 of the dent T1, and a shape of the dent T1 may be sufficiently modified during a subsequent process. Thus, the dent T1 may not necessarily be formed to a specific depth L2.

Figure 11A:
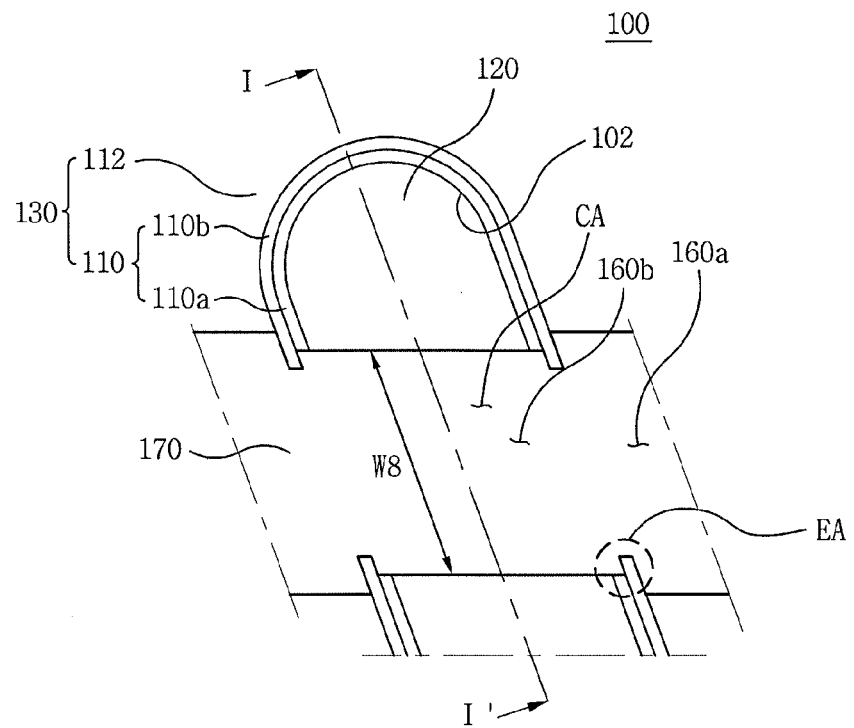
Figure 11B:
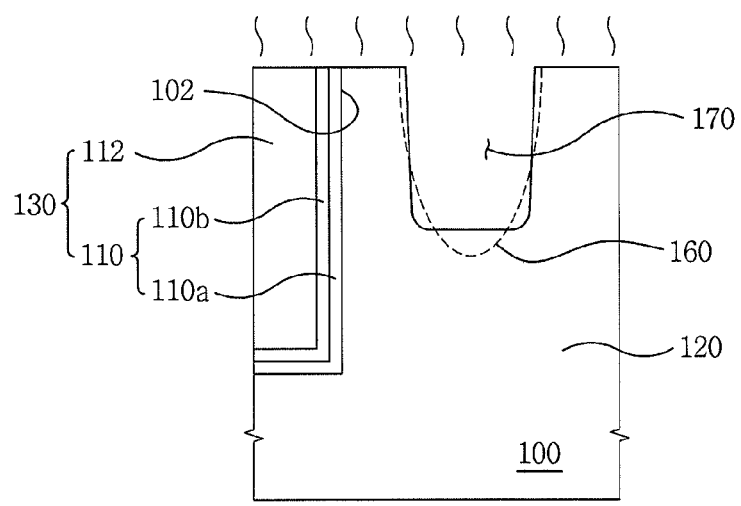

Referring to FIGS. 11A and 11B, the exposed silicon surface of the active region 120 may be reflowed to form a gate trench 170. The reflow process may include, e.g., annealing the substrate 100 in an atmosphere of hydrogen ($H_2$) gas or an inert gas. Referring to FIG. 11A, in the second region 160b, silicon atoms may move from the edge area EA of the preliminary gate trench (refer to 160 in FIG. 10A) to the central area CA (which may be more thermodynamically stable than the edge area EA). While the silicon atoms are moving from the edge area EA to the central area CA, the pointed portions of the edge area EA may be lost or removed, and the central area CA may thicken. Although the dent T1 may be lost or may remain in a reduced shape, the pointed portions of the edge area EA may be completely lost or removed to eliminate the dent T1. Due to the reflow process, the gate trench 170 (having an eighth width W8) may be formed in the second region 160b. The eighth width W8 may be greater than the fourth width (refer to W4 in FIG. 9A). The eighth width W8 may approximate or may be equal to the maximum width (refer to Wmax in FIG. 9A).

Referring to FIG. 11B, due to the reflow process, silicon atoms may move from a lateral surface of the preliminary gate trench (refer to 160 in FIG. 10A) to a bottom surface thereof, which may be more thermodynamically stable than the lateral surface of the preliminary gate trench. While the silicon atoms are centering on the bottom surface of the preliminary gate trench 160 (in FIG. 10A), the center of the bottom surface may be lifted upwardly. When the bottom surface is lifted, a lower width of the bottom surface may increase, and a depth of the gate trench 170 may decrease. Thus, an inner surface of the gate trench 170 may be improved.

The annealing process using $H_2$ gas may be performed for about several seconds to about several minutes in an airtight chamber maintained at an internal temperature of about 650 to about 1,000° C. under an internal pressure of about 0.1 to about 10 Torr by supplying $H_2$ gas at a flow rate of about 0.1 to about 50 standard liters per minute (SLM). Respective process factors may be variously applied according to an amount and profile of silicon to be reflowed. For example, to promote the reflow process, the flow rate of $H_2$ gas may be increased, the inner pressure of the chamber may be reduced, and/or the inner temperature of the chamber may be elevated.

Figure 12A:
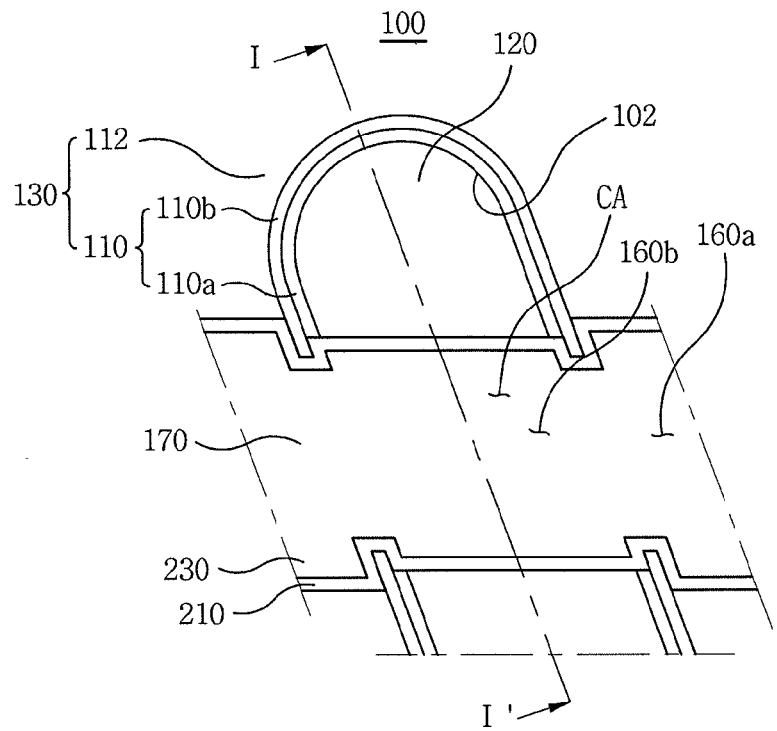
Figure 12B:
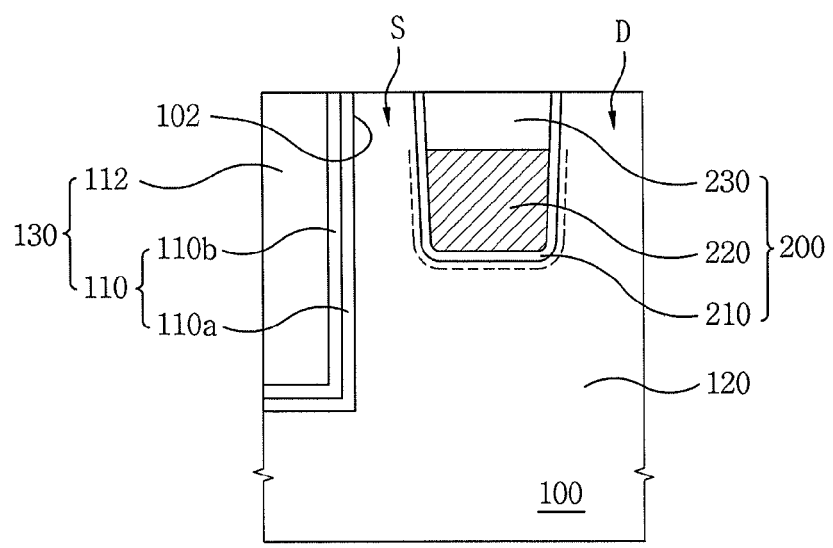

Referring to FIGS. 12A and 12B, a gate electrode 200 may be formed. First, a gate insulating layer 210 may be conformally formed on an inner wall of the gate trench 170 (e.g., along a surface thereof) using a thermal oxidation process. The gate insulating layer 210 may include, e.g., a thermal silicon oxide layer or a metal oxide layer, such as a titanium oxide layer or a hafnium oxide layer. A gate conductive pattern 220 may be formed on the gate insulating layer 210 using, e.g., a CVD process or a sputtering process. The gate conductive pattern 220 may include, e.g., doped polysilicon (poly-Si), a metal, or a metal compound. A top surface of the gate conductive pattern 220 may be lower than a top surface of the substrate 100. A gate capping pattern 230 may be formed on the gate conductive pattern 220 to protect the gate conductive pattern 220. The gate capping pattern 230 may include, e.g., a silicon nitride layer. Afterwards, a CMP process may be performed to remove components disposed on, e.g., above the top surface of, the substrate 100. Thus, the gate electrode 200 (including the gate insulating layer 210, the gate conductive pattern 220, and the gate capping pattern 230) may be formed. An ion implantation process may be performed to form a source region S and a drain region D in the substrate 100 at sides of the gate capping pattern 230. Thus, a recessed channel RC (see FIG. 1A) may be formed by the source and drain regions S and D under the gate insulating layer 210.

Figure 13A:
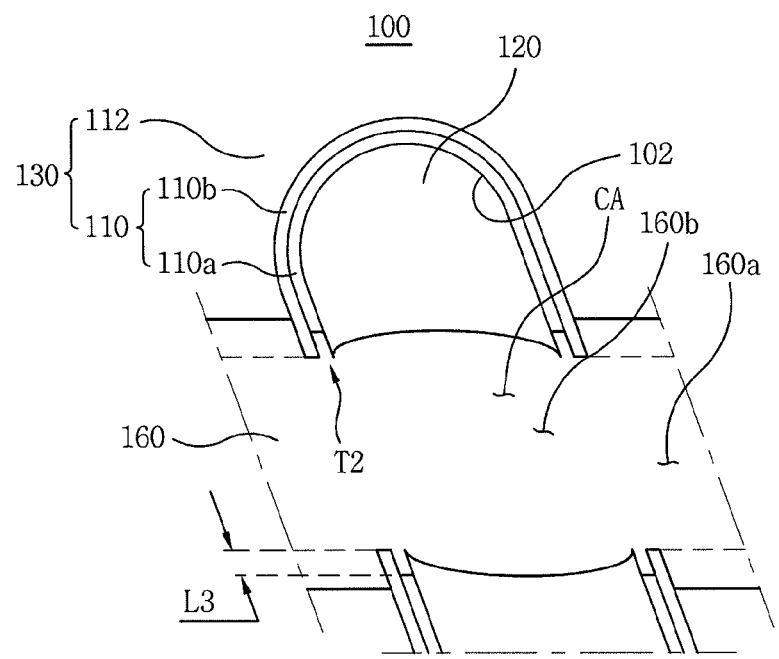
FIGS. 13A through 15D illustrate plan views showing stages in methods of fabricating semiconductor devices according to various embodiments.
Figure 13B:
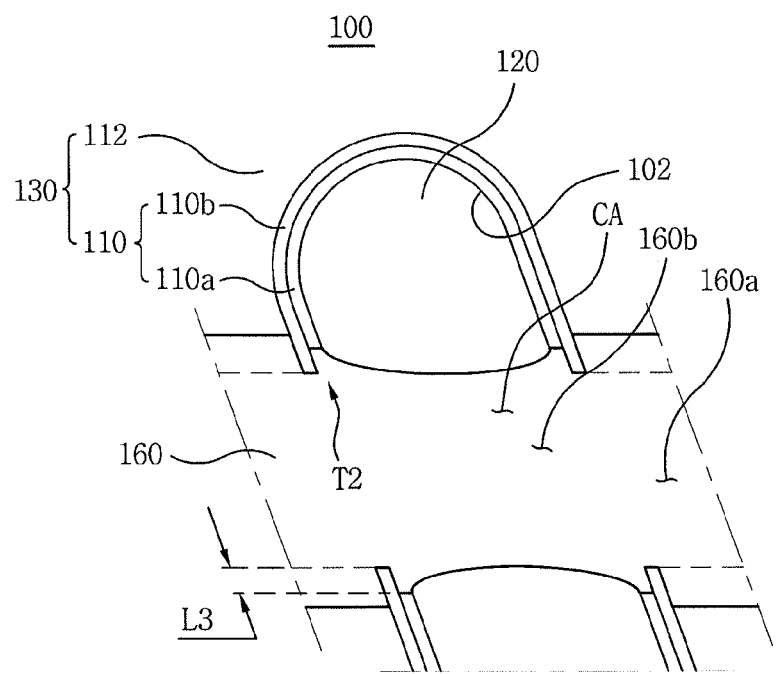

FIGS. 13A and 13B illustrate plan views showing a stage in a method of fabricating the semiconductor device of FIG. 2.

Referring to FIG. 13A, the process described with reference to FIGS. 10A and 10B may be performed, thereby removing the pad insulating pattern 142, a portion of the liner 110, and a portion of the insulating material 112. During the removal process, the isolation region 120 and the first liner 110a may be removed in greater widths or to greater degrees than in the process described with reference to FIGS. 10A and 10B. Although FIG. 13A illustrates that a depth L3 of a dent T2 is greater than the maximum width (refer to Wmax in FIG. 9A) of the central area CA, the depth L3 of the dent T2 shown in FIG. 13 is only an example.

Referring to FIG. 13B, a reflow process (similar to that described with reference to FIGS. 11A and 11B) may be performed to convert the central area CA into a convex active region 120. A shape of the convex active region 120 shown in FIG. 13B may be obtained by optimizing the depth L3 of the dent T2 and various conditions of the reflow process. For example, the shape of the convex active region 120 may be understood with reference to shapes shown in FIGS. 4A through 4C. Afterwards, the processes described with reference to FIGS. 12A and 12B may be further performed to form the shape shown in FIG. 2.

FIGS. 14A through 14D illustrate plan views showing stages in methods of fabricating the semiconductor devices of FIGS. 4A to 4C. The present embodiments will be described on assumption that the liner 110 includes a single layer.

Figure 14A:
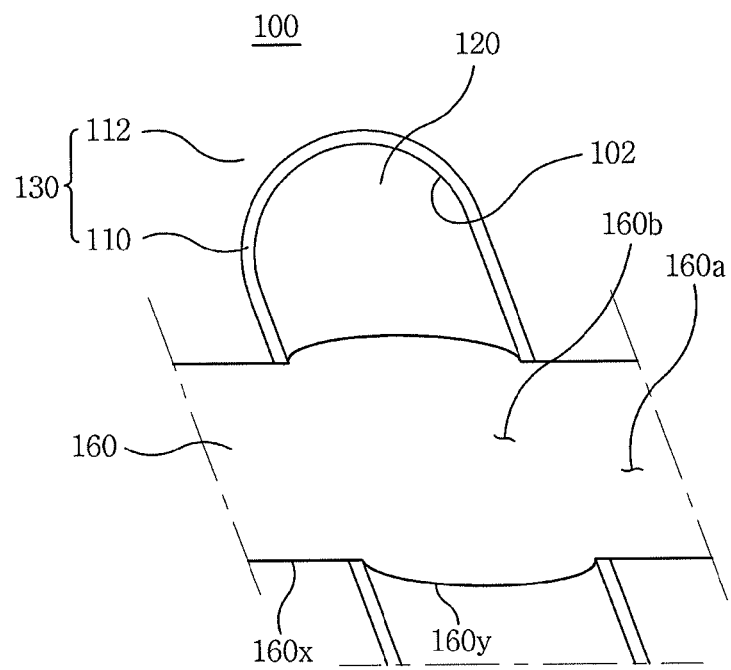

Referring to FIG. 14A, the processes described with reference to FIGS. 4A through 9B may be performed, thereby forming the preliminary gate trench 160. To facilitate understanding, the pad insulating pattern 142 and the mask pattern 152 are omitted, unlike in FIGS. 9A and 9B. The preliminary gate trench 160 may include a first sidewall 160x (disposed in the first region 160a), and a second sidewall 160y (disposed in the second region 160b).

Figure 14B:
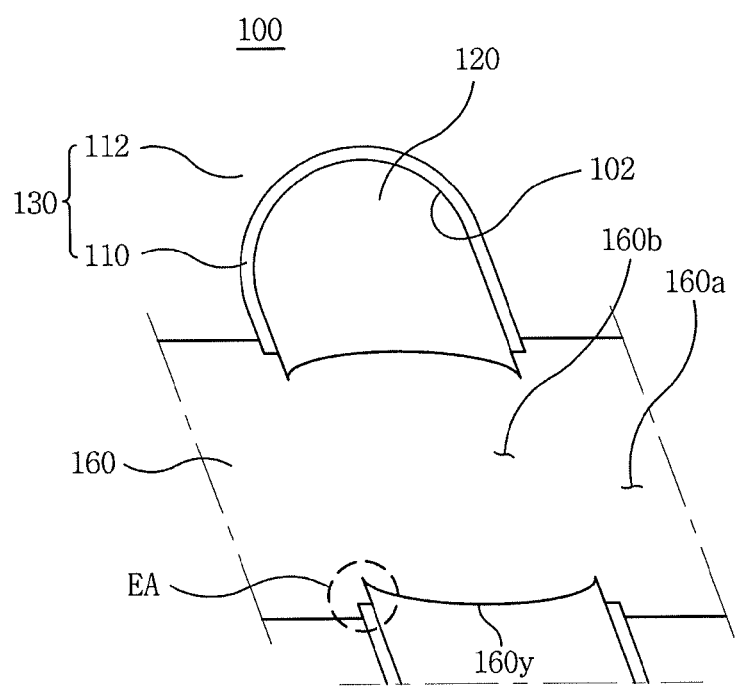

Referring to FIG. 14B, the processes described with reference to FIGS. 10A and 10B may be performed to remove a portion of the insulating material 112 and a portion of the liner 110. The insulating material 112 may be removed in a greater width or to a greater degree than the liner 110. The liner 110 may include, e.g., a thermal silicon oxide layer, and the insulating material 112 may include, e.g., deposited silicon oxide. Thus, end portions of the active region 120 in the edge area EA may be formed and exposed in pointed shapes.

Figure 14C:
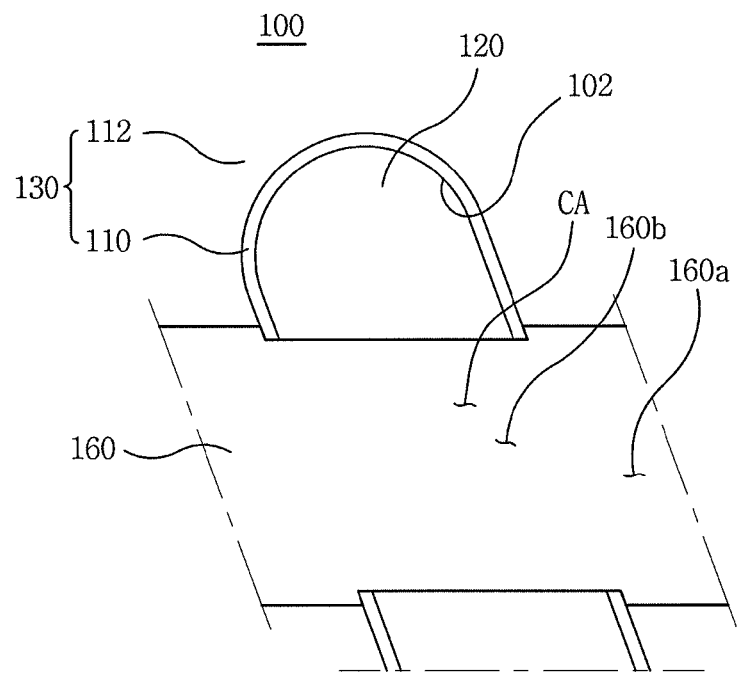

Referring to FIG. 14C, the reflow process described with reference to FIGS. 11A and 11B may be performed to linearize or planarize the second sidewall 160y. Afterwards, a process of forming the gate electrode 200 may be performed with reference to FIGS. 12A and 12B.

Figure 14D:
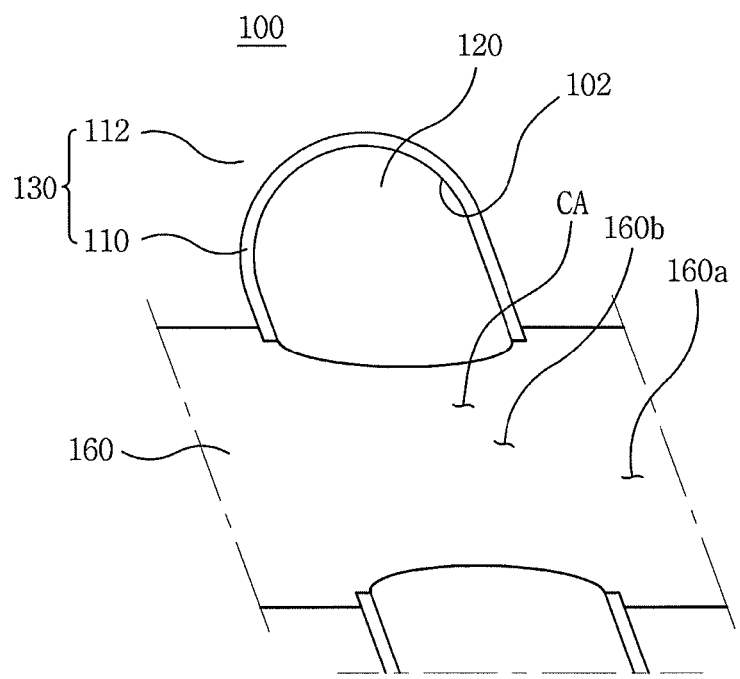

Alternatively, referring to FIG. 14D, after the process described with reference to FIG. 14B is performed, the reflow process described with reference to FIGS. 11A and 11B may be performed to convexly form the second sidewall 160y. Afterwards, a process of forming the gate electrode 200 may be performed with reference to FIGS. 12A and 12B. Thus, any one of the semiconductor devices 10d to 10f shown in FIGS. 4A through 4C may be formed.

FIGS. 15A through 15D illustrate plan views showing stages in a method of fabricating the semiconductor devices of FIGS. 5A to 6. The present embodiments will be described on assumption that the liner 110 includes a triple layer. A first liner 110a, a second liner 110b, and a third liner 110c may be understood with reference to FIGS. 5A and 5B.

Figure 15A:
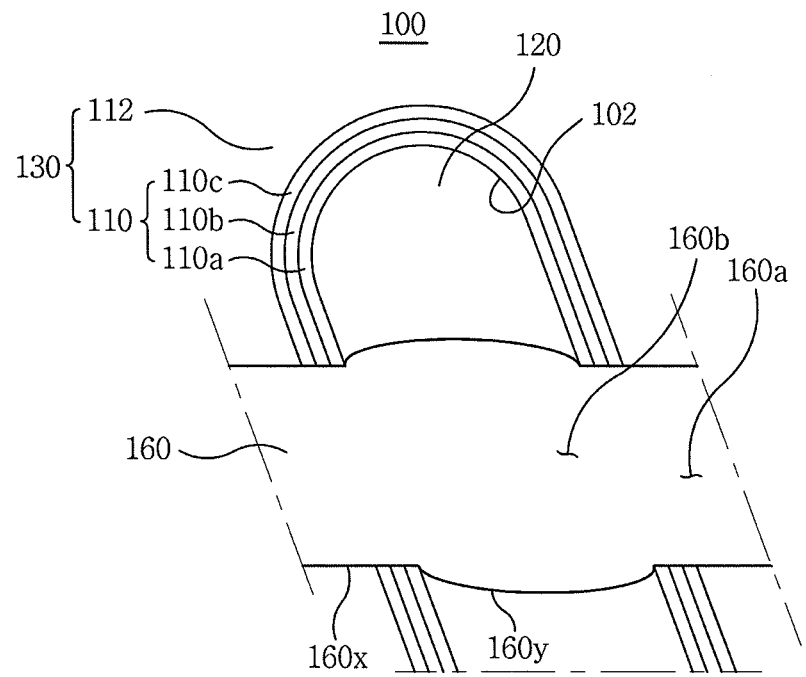

Referring to FIG. 15A, the processes described with reference to FIGS. 4A through 9B may be performed to form the preliminary gate trench 160. To facilitate understanding, the pad insulating pattern 142 is omitted as in FIG. 14A, unlike in FIGS. 9A and 9B. As shown in FIG. 14A, the preliminary gate trench 160 may include the first sidewall 160x (disposed in a first region 160a) and the second sidewall 160y (disposed in a second region 160b). The first and third liners 110a and 110c may include, e.g., thermal silicon oxide, and the second liner 110b may include, e.g., silicon nitride. The insulating material 112 may include, e.g., silicon oxide that may be obtained using a deposition or coating process.

Figure 15B:
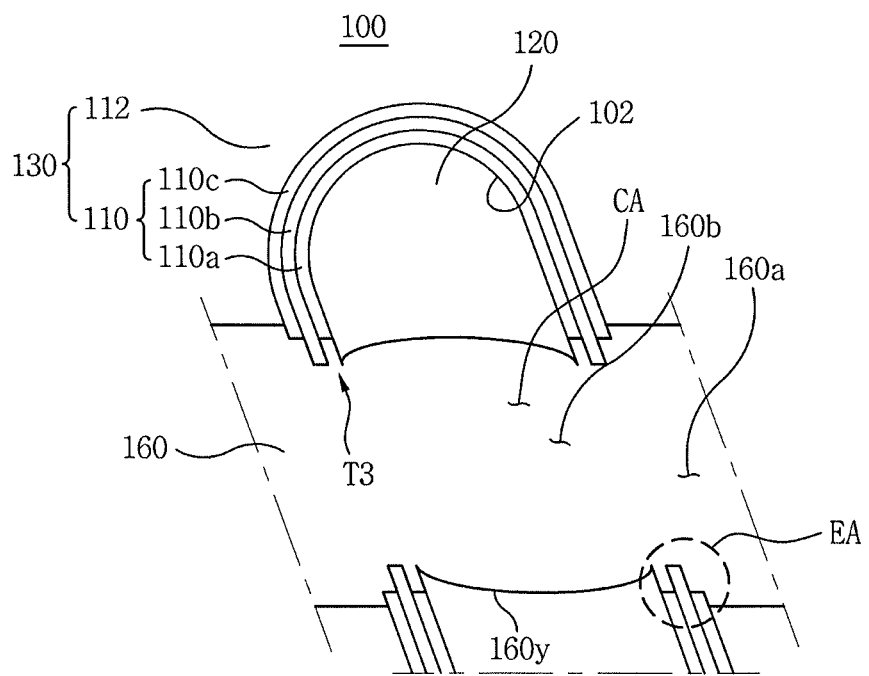

Referring to FIG. 15B, the processes described with reference to FIGS. 10A and 10B may be performed, thereby partially removing the first liner 110a, the third liner 110c, and the insulating material 112. Due to the removal process, a dent T3 may be formed at an edge area EA to expose a pointed portion of the active region 120. The second liner 110b and the active region 120 may not be removed and may have protruding shapes. End portions of the active region 120 may be formed and exposed in pointed shapes. The first and third liners 110a and 110c may be removed to the same or about the same extent or degree, and the insulating material 112 may be removed in a greater width or to a greater degree than the first and third liners 110a and 110c.

Figure 15C:
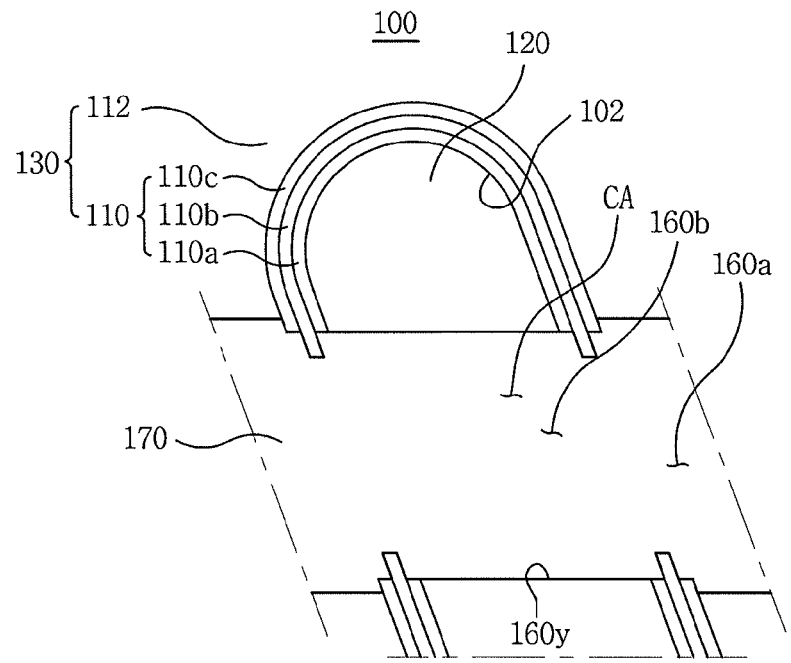

Referring to FIG. 15C, the reflow process described with reference to FIGS. 11A and 11B may be performed to linearize or planarize the second sidewall 160y. Afterwards, a process of forming the gate electrode 200 may be performed with reference to FIGS. 12A and 12B. Thus, the semiconductor device 10g shown in FIGS. 5A and 5B may be formed.

Figure 15D:
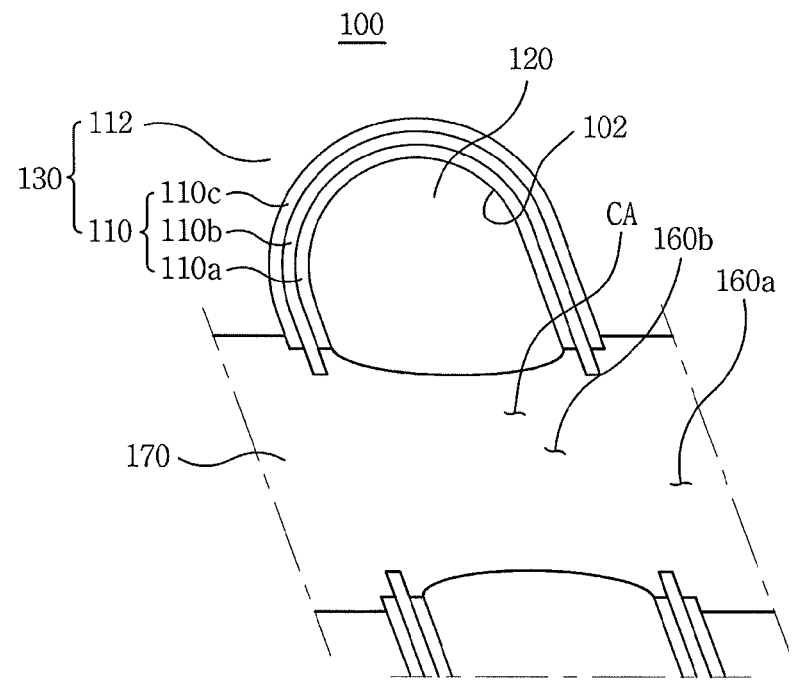

Alternatively, referring to FIG. 15D, after the process described with reference to FIG. 15B is performed, the reflow process described with reference to FIGS. 11A and 11B may be performed, thereby convexly forming the second sidewall 160y. Thereafter, a process of forming the gate electrode 200 may be performed with reference to FIGS. 12A and 12B. Thus, the semiconductor device 10h shown in FIG. 6 may be formed.

Figure 16A:
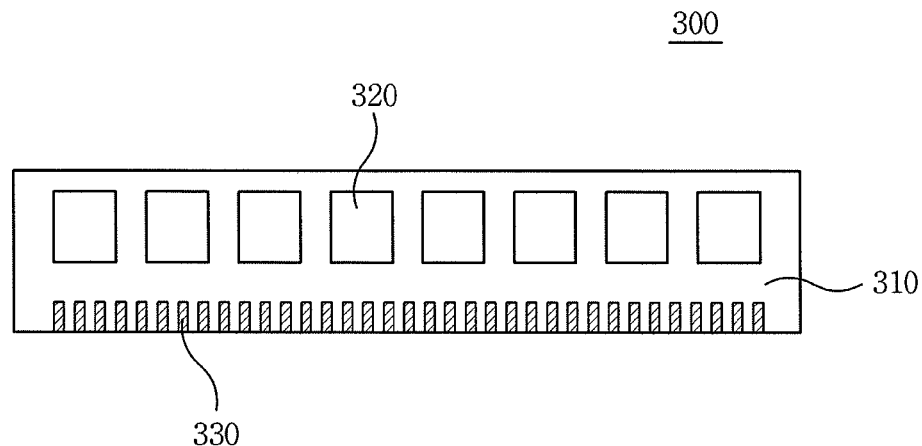
FIGS. 16A through 16C respectively illustrate block diagrams of a semiconductor module, an electronic system, and a memory card including various semiconductor devices according to embodiments.
Figure 16B:
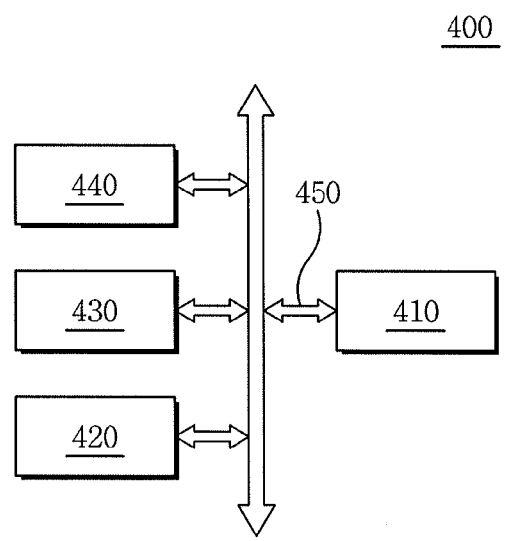
Figure 16C:
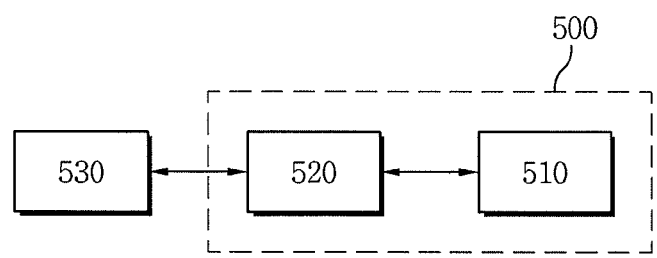

FIGS. 16A through 16C illustrate block diagrams of a semiconductor module, an electronic system, and a memory card including various semiconductor devices according to the embodiments.

Referring to FIG. 16A, the semiconductor devices 10a to 10h according to various embodiments may be applied to a semiconductor module 300. The semiconductor module 300 may include a module substrate 310, semiconductor integrated circuit (IC) chips 320 mounted on the module substrate 310, and module contact terminals 330 disposed in a row at one side of the module substrate 310 and electrically connected to the semiconductor IC chips 320. At least one of the semiconductor IC chips 320 may be a semiconductor IC chip to which semiconductor devices according to embodiments are applied. The semiconductor module 300 may be connected to an external electronic apparatus through the module contact terminals 330.

Referring to FIG. 16B, the semiconductor devices 10a to 10h according to the embodiments may be applied to an electronic system 400. The electronic system 400 may include a controller 410, an input/output (I/O) device 420, and a memory device 430. The controller 410, the I/O device 420, and the memory device 430 may be combined with one another through a bus 450 that functions as a data transmission path. The controller 410 may include, e.g., one or more microprocessors (MPs), digital signal processors (DSPs), microcontrollers (MCs), and/or logic devices capable of similar functions thereto. The controller 410 and the memory device 430 may include at least one of the semiconductor devices 10a to 10h according to the embodiments. The I/O device 420 may include at least one selected out of a keypad, a keyboard, and a display device. The memory device 430 may store data and/or commands executed by the controller 410. The memory device 430 may include a volatile memory device, e.g., a dynamic random access memory (DRAM), and/or a nonvolatile memory device, e.g., a flash memory. The electronic system 400 may further include an interface 440 configured to transmit or receive data to or from a communication network. The interface 440 may be a wired/wireless interface. For example, the interface 440 may include an antenna or a wired/wireless transceiver. The electronic system 400 may be embodied by a mobile system, a personal computer (PC), an industrial computer, or a logic system capable of various functions.

Referring to FIG. 16C, the semiconductor devices 10a to 10h according to the embodiments may be provided as a memory card 500. For example, the memory card 500 may include a nonvolatile memory device 510 and a memory controller 520. The nonvolatile memory device 510 and the memory controller 520 may store data or read the stored data. The nonvolatile memory device 510 may include, e.g., nonvolatile memory devices to which semiconductor devices according to embodiments are applied. The memory controller 520 may control the nonvolatile memory device 510 to read stored data or store data in response to read/write requests of a host 530.

In addition, the names and functions of unshown or undescribed components may be easily understood with reference to other drawings of the present specification and descriptions thereof.

By way of summation and review, a recessed-channel-array-transistor (RCAT) structure, when a transistor including a recessed channel is formed, may include a pointed portion at an edge portion of an active region disposed adjacent to an isolation region. When a semiconductor device electrically operates, an electric field may concentrate on the pointed portion, thereby causing an undesirable leakage current.

The embodiments provide a method of removing the pointed portion by annealing a silicon surface of the active region, which is exposed in a preliminary gate trench, so that silicon atoms can move from the pointed portion to a central area of the preliminary gate trench, which is more thermodynamically stable than the pointed portion. In order to effectively remove the pointed portion and improve the shape of the active region, various methods of removing liners included in the isolation region have been considered.

The method of fabricating a semiconductor device according to the embodiments may expect the following effects. First, in a semiconductor device including a recessed channel or buried channel, an inner silicon surface of a preliminary recess-channel trench damaged by a plasma process may be cured by performing an annealing process, and pointed portions of corners of the preliminary recess-channel trench may be removed. Thus, concentration of an electric field on specific portions may be prevented, thereby advantageously reducing leakage current. As a result, power consumption may be reduced and data storage capability may be improved. Second, a channel may be convexly formed to increase the width of the channel, thereby enhancing drivability of a gate.

Example embodiments have been disclosed herein, and although specific terms are employed, they are used and are to be interpreted in a generic and descriptive sense only and not for purpose of limitation. In some instances, as would be apparent to one of ordinary skill in the art as of the filing of the present application, features, characteristics, and/or elements described in connection with a particular embodiment may be used singly or in combination with features, characteristics, and/or elements described in connection with other embodiments unless otherwise specifically indicated. Accordingly, it will be understood by those of skill in the art that various changes in form and details may be made without departing from the spirit and scope of the present invention as set forth in the following claims.

What is claimed is:

1. A method of fabricating a semiconductor device, the method comprising:
   providing a substrate;
   removing a part of the substrate to form an isolation trench;
   forming a first liner on an inner surface of the isolation trench;
   forming a second liner on the first liner;
   forming an insulating material on the second liner until the isolation trench is filled to form an isolation region defining an active region in the substrate;
   forming a preliminary gate trench in the substrate, the preliminary gate trench including:
   a first region disposed across the isolation region to expose the first liner, the second liner, and the insulating material, and
   a second region disposed across the active region to expose a portion of the substrate, the first region having a first sidewall with a planar shape, and the second region having a second sidewall with a concave central area such that an interface between the first and second regions has a pointed portion;
removing a portion of the first liner exposed by the first region to form a dent such that the dent has a first depth by which the pointed portion protrudes;
removing the pointed portion by performing a reflow process to convert the preliminary gate trench into a gate trench; and
forming a gate insulating layer, a gate conductive pattern, and a gate capping pattern within the gate trench.

2. The method as claimed in claim 1, wherein:
the substrate includes silicon,
the first liner includes thermal silicon oxide,
the second liner includes silicon nitride, and
the insulating material includes silicon oxide.

3. The method as claimed in claim 1, wherein:
the first region of the preliminary gate trench has a first width,
the second region of the preliminary gate trench has a second average width, and
the second average width is greater than the first width.

4. The method as claimed in claim 3, wherein:
a first region of the gate trench has a third width,
a second region of the gate trench has a fourth average width, and
the fourth average width is smaller than the third width.

5. The method as claimed in claim 4, wherein the second average width is smaller than the fourth average width.

6. The method as claimed in claim 4, wherein the second average width is greater than the first width by a first length, and the first depth of the dent is greater than the first length.

7. The method as claimed in claim 4, wherein the second region of the preliminary gate trench has a maximum width and a minimum width, the maximum width being greater than the fourth average width and the minimum width being smaller than the fourth average width.

8. The method as claimed in claim 1, wherein removing the pointed portion includes linearizing or planarizing the second sidewall of the second region of the preliminary gate trench.

9. The method as claimed in claim 1, wherein removing the pointed portion includes leading silicon atoms of the pointed portion to move toward the concave central area of the second sidewall to convexly transform the second sidewall of the gate trench.

10. The method as claimed in claim 1, wherein performing the reflow process includes annealing the protruding pointed portion in a hydrogen-containing gas atmosphere in an airtight chamber maintained under a pressure of about 0.1 to about 10 Torr at a temperature of about 650 to about 1,000° C. by supplying hydrogen gas at a flow rate of about 0.1 to about 50 standard liters per minute.

11. The method as claimed in claim 1, wherein removing the portion of the first liner exposed by the first region to form the protruding pointed portion includes removing a portion of the insulating material exposed by the first region to a depth greater than the first depth.

12. A method of fabricating a semiconductor device, the method comprising:
providing a substrate;
removing a part of the substrate to form an isolation trench;
forming a first liner on an inner surface of the isolation trench;
forming an insulating material on the first liner until the isolation trench is filled to form an isolation region defining an active region in the substrate;
forming a preliminary gate trench in the substrate, the preliminary gate trench including:
a first region disposed across the isolation region to expose the first liner and the insulating material, and
a second region disposed across the active region to expose a portion of the substrate, the first region having a first width, a central area of the second region having a second width greater than the first width, and the substrate having a pointed portion at an interface between the first region and the second region;
increasing the first width of the first region to protrude the pointed portion;
removing the pointed portion by performing a reflow process to convert the preliminary gate trench into a gate trench; and
forming a gate insulating layer, a gate conductive pattern, and a gate capping pattern within the gate trench.

13. The method as claimed in claim 12, wherein forming the isolation region includes further forming a second liner between the first liner and the insulating material, such that a portion of the second liner is exposed in the first region.

14. The method as claimed in claim 12, wherein removing the pointed portion includes reducing the second width of the second region.

15. The method as claimed in claim 12, wherein increasing the first width includes simultaneously removing a portion of the first liner and removing a portion of the insulating material.

16. A method of fabricating a semiconductor device, the method comprising:
providing a substrate;
forming an isolation trench in the substrate;
forming a first liner on an inner surface of the isolation trench;
filling an insulating material in the isolation trench to form an isolation region such that the isolation region defines an active region in the substrate;
forming a preliminary gate trench in the substrate, the preliminary gate trench including:
a first region in the isolation region and exposing the first liner and the insulating material, and
a second region in the active region and exposing a portion of the substrate, the first region having a first sidewall with a planar shape, and the second region having a second sidewall with a concave central area such that an interface between the first and second regions has a pointed portion;
removing a portion of the first liner exposed by the first region to form a dent such that the dent has a first depth, the pointed portion protruding adjacent to the dent;
removing the pointed portion by performing a reflow process such that the preliminary gate trench is converted into a gate trench; and
forming a gate electrode within the gate trench such that the gate electrode includes a gate insulating layer, a gate conductive pattern, and a gate capping pattern.

17. The method as claimed in claim 16, further comprising forming a second liner on the first liner prior to filling the insulating material in the isolation trench.

18. The method as claimed in claim 16, wherein:
the first region has a first width, and
all portions of the concave central area of the second region have a width greater than the first width.

19. The method as claimed in claim 16, wherein an interface between the active region and the gate electrode has a planar shape.

20. The method as claimed in claim 16, wherein an interface between the active region and the gate electrode has a curved shape that convexly protrudes into the gate electrode.

\* \* \* \* \*